US011670656B2

(12) United States Patent
Ootsuka

(10) Patent No.: US 11,670,656 B2
(45) Date of Patent: Jun. 6, 2023

(54) IMAGING ELEMENT, FABRICATION METHOD, AND ELECTRONIC EQUIPMENT

(71) Applicant: SONY SEMICONDUCTOR SOLUTIONS CORPORATION, Kanagawa (JP)

(72) Inventor: Yoichi Ootsuka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/527,932

(22) Filed: Nov. 16, 2021

(65) Prior Publication Data

US 2022/0077203 A1    Mar. 10, 2022

Related U.S. Application Data

(63) Continuation of application No. 16/478,416, filed as application No. PCT/JP2018/001087 on Jan. 17, 2018, now Pat. No. 11,217,615.

(30) Foreign Application Priority Data

Jan. 30, 2017   (JP) ................................ 2017-014311
Sep. 25, 2017   (JP) ................................ 2017-183150

(51) Int. Cl.
*H01L 27/146*     (2006.01)
*G02B 1/111*      (2015.01)
*G02B 5/20*       (2006.01)

(52) U.S. Cl.
CPC .......... *H01L 27/1462* (2013.01); *G02B 1/111* (2013.01); *G02B 5/20* (2013.01); *H01L 27/14605* (2013.01); *H01L 27/14627* (2013.01)

(58) Field of Classification Search
CPC ........... H01L 27/1462; H01L 27/14627; H01L 27/14605; G02B 5/20; G02B 1/111
See application file for complete search history.

(56) References Cited

U.S. PATENT DOCUMENTS 8,557,626 B2 * 10/2013 Liu ................... H01L 27/14623
                                              438/69
11,217,615 B2    1/2022 Ootsuka
                  (Continued)

FOREIGN PATENT DOCUMENTS

JP    2009-021379    1/2009
JP    2010-062417    3/2010
                  (Continued)

OTHER PUBLICATIONS

International Search Report and Written Opinion for International (PCT) Patent Application No. PCT/JP2018/001087, dated Mar. 20, 2018, 8 pages.

(Continued)

*Primary Examiner* — Sitaramarao S Yechuri
(74) *Attorney, Agent, or Firm* — Sheridan Ross P.C.

(57) ABSTRACT

The present disclosure relates to an imaging element, a fabrication method, and electronic equipment by which an image having higher picture quality can be imaged. The imaging element includes a first light absorbing film formed in an effective pixel peripheral region, the effective pixel peripheral region being provided so as to enclose an outer side of an effective pixel region in which a plurality of pixels is disposed in a matrix, so as to cover a semiconductor substrate, a microlens layer provided as an upper layer than the first light absorbing film and having a microlens formed so as to condense light for each of the pixels in the effective pixel region, and a second light absorbing film provided as an upper layer than the microlens layer and formed in the (Continued)

effective pixel peripheral region. The present technology can be applied, for example, to a CMOS image sensor.

19 Claims, 22 Drawing Sheets

(56) References Cited

U.S. PATENT DOCUMENTS

| | | | | |
|---|---|---|---|---|
| 2002/0141067 | A1* | 10/2002 | Takakuwa | G02F 1/133526 |
| | | | | 359/620 |
| 2008/0185603 | A1* | 8/2008 | Itoi | A61B 1/05 |
| | | | | 257/E33.059 |
| 2009/0014824 | A1 | 1/2009 | Sakoh et al. | |
| 2012/0147208 | A1* | 6/2012 | Otsuka | H01L 27/14629 |
| | | | | 257/E31.127 |
| 2013/0134537 | A1 | 5/2013 | Nakajiki et al. | |
| 2014/0253756 | A1* | 9/2014 | Yokogawa | H01L 27/14625 |
| | | | | 348/229.1 |
| 2014/0367817 | A1* | 12/2014 | Furuta | H01L 27/14629 |
| | | | | 257/432 |
| 2015/0021729 | A1 | 1/2015 | Maehara | |
| 2016/0370579 | A1* | 12/2016 | Cho | G02B 5/005 |

FOREIGN PATENT DOCUMENTS

| | | |
|---|---|---|
| JP | 2010-085755 | 4/2010 |
| JP | 2012-124377 | 6/2012 |
| JP | 2013-012518 | 1/2013 |
| JP | 2013-115335 | 6/2013 |
| JP | 2015-023163 | 2/2015 |
| WO | WO 2013/111419 | 8/2013 |

OTHER PUBLICATIONS

Official Action for U.S. Appl. No. 16/478,416, dated May 4, 2021, 15 pages.
Notice of Allowance for U.S. Appl. No. 16/478,416, dated Aug. 16, 2021, 7 pages.
Corrected Notice of Allowance for U.S. Appl. No. 16/478,416, dated Nov. 17, 2021, 2 pages.

* cited by examiner

FIG.2
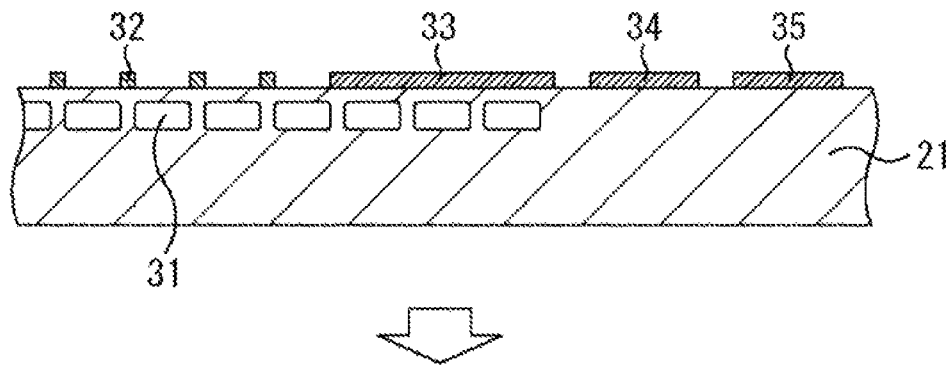
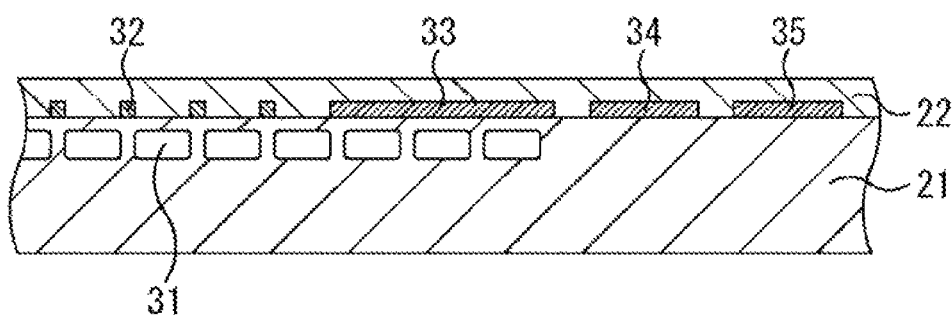
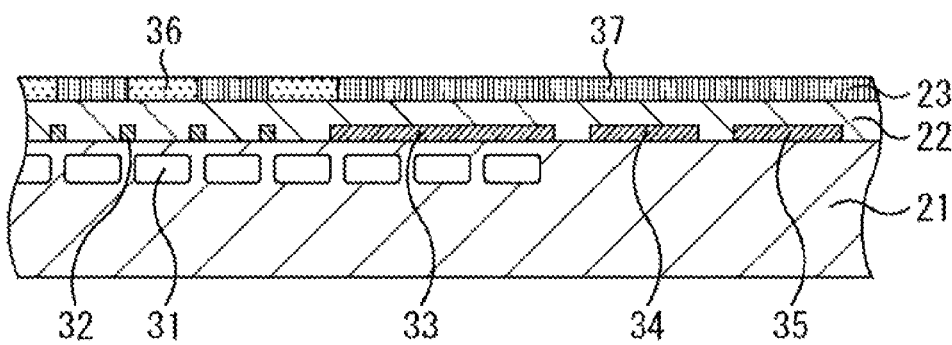

IMAGING ELEMENT, FABRICATION METHOD, AND ELECTRONIC EQUIPMENT

CROSS REFERENCE TO RELATED APPLICATIONS

This application is a continuation of and claims priority to U.S. application Ser. No. 16/478,416, filed Jul. 16, 2019, which is a national stage application under 35 U.S.C. 371 and claims the benefit of PCT Application No. PCT/JP2018/001087 having an international filing date of Jan. 17, 2018, which designated the United States, which PCT application claimed the benefit of Japanese Patent Application Nos. 2017-014311, filed Jan. 30, 2017, and 2017-183150, filed Sep. 25, 2017, the entire disclosures of each of which are incorporated herein by reference.

TECHNICAL FIELD

The present disclosure relates to an imaging element, a fabrication method, and electronic equipment, and relates particularly to an imaging element, a fabrication method, and electronic equipment by which an image having higher picture quality can be imaged.

BACKGROUND ART

In recent years, a solid-state imaging apparatus is used for various image inputting equipment such as a video camera, a digital still camera, and a facsimile. The solid-state imaging apparatus has a pixel region in which a plurality of pixels that generates signal charge in response to an incident light amount are disposed in a matrix, and the signal charge generated by each pixel is outputted as an image signal to the outside.

Incidentally, in a solid-state imaging apparatus of the related art, light incident to an effective pixel peripheral region provided so as to enclose the outer side of an effective pixel region in which pixels for configuring an image are disposed is sometimes reflected and becomes stray light, resulting in appearance of flare, ghost, or the like in the image.

Therefore, in order to suppress appearance of flare, ghost, or the like by stray light, for example, PTL 1 proposes a solid-state imaging element configured such that a three-layer color filter is stacked in a lower layer than a microlens layer in the effective pixel peripheral region.

CITATION LIST

Patent Literature
[PTL 1]
Japanese Patent Laid-Open No. 2010-62417

SUMMARY

Technical Problem

While a countermeasure for suppressing appearance of flare, ghost, or the like by stray light is taken in the related art as described above, the suppression effect is not sufficient and it is demanded that a countermeasure having a higher suppression effect is performed.

For example, in order to attain a sufficient light blocking ability in the solid-state imaging element disclosed in PTL 1, it is examined to increase the thickness of the color filter in the effective pixel peripheral region. However, in the structure of the solid-state imaging element disclosed in PTL 1, in the case where the thickness of the color filter in the effective pixel peripheral region is increased, coating unevenness becomes liable to occur upon coating formation of a flattening film or a microlens material to be stacked on an upper layer than the layer of the color filter. It is worried that also such coating unevenness described above may have a harmful influence on the picture quality.

The present disclosure has been made in view of such a situation as described above and makes it possible to image an image having higher picture quality.

Solution to Problem

An imaging element according to one aspect of the present disclosure includes: a first light absorbing film formed in an effective pixel peripheral region, the effective pixel peripheral region being provided so as to enclose an outer side of an effective pixel region in which a plurality of pixels is disposed in a matrix, so as to cover a semiconductor substrate; a microlens layer provided as an upper layer than the first light absorbing film and having a microlens formed so as to condense light for each of the pixels in the effective pixel region; and a second light absorbing film provided as an upper layer than the microlens layer and formed in the effective pixel peripheral region.

A fabrication method according to the one aspect of the present disclosure includes the steps of: forming a first light absorbing film in an effective pixel peripheral region, the effective pixel peripheral region being provided so as to enclose an outer side of an effective pixel region in which a plurality of pixels is disposed in a matrix, so as to cover a semiconductor substrate; forming, in a microlens layer provided as an upper layer than the first light absorbing film, a microlens for condensing light for each of the pixels in the effective pixel region; and forming a second light absorbing film provided as an upper layer than the microlens layer in the effective pixel peripheral region.

Electronic equipment according to the one aspect of the present disclosure includes an imaging element including: a first light absorbing film formed in an effective pixel peripheral region, the effective pixel peripheral region being provided so as to enclose an outer side of an effective pixel region in which a plurality of pixels is disposed in a matrix, so as to cover a semiconductor substrate; a microlens layer provided as an upper layer than the first light absorbing film and having a microlens formed so as to condense light for each of the pixels in the effective pixel region; and a second light absorbing film provided as an upper layer than the microlens layer and formed in the effective pixel peripheral region.

In the one aspect of the present disclosure, the first light absorbing film formed in an effective pixel peripheral region, which is provided so as to enclose an outer side of an effective pixel region in which a plurality of pixels is disposed in a matrix, so as to cover a semiconductor substrate, the microlens for condensing light for each of the pixels in the effective pixel region is formed in the microlens layer provided as an upper layer than the first light absorbing film, and the second light absorbing film provided as an upper layer than the microlens layer is formed in the effective pixel peripheral region.

Advantageous Effect of Invention

With the aspect of the present disclosure, an image of higher picture quality can be imaged.

BRIEF DESCRIPTION OF DRAWINGS

FIG. 2 is a view illustrating first to third steps.

DESCRIPTION OF EMBODIMENTS

In the following, particular embodiments to which the present technology is applied are described in detail with reference to the drawings.

<First Configuration Example of Imaging Element>

Figure 1:
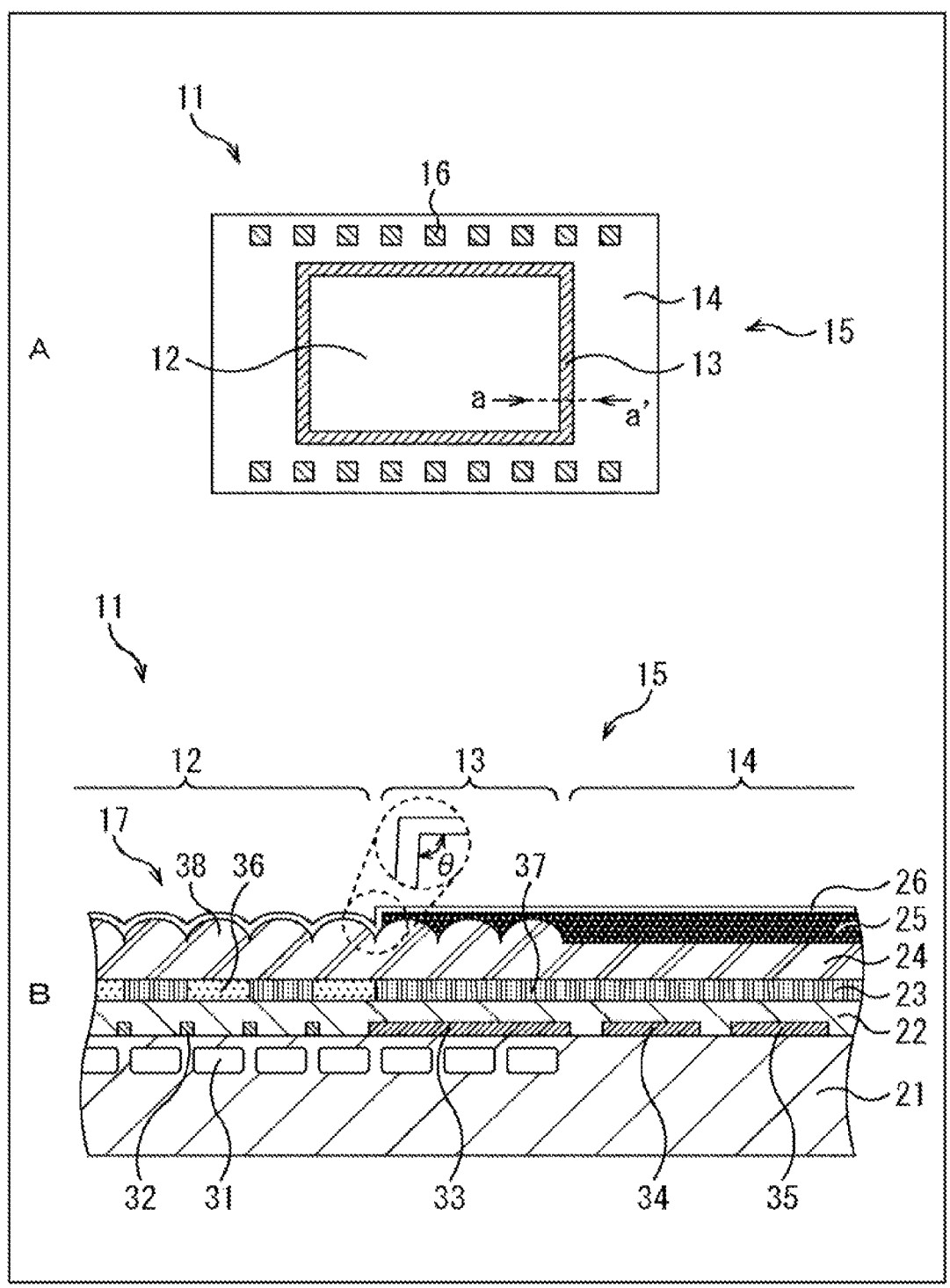
FIG. 1 is a view depicting an example of a configuration of a first embodiment of an imaging element to which the present technology is applied.

FIG. 1 is a view depicting an example of a configuration of a first embodiment of an imaging element to which the present technology is applied. A of FIG. 1 depicts a schematic configuration when the imaging element 11 is viewed in plan, and an a-a' cross section of the imaging element 11 of A of FIG. 1 is depicted in B of FIG. 1.

As depicted in A of FIG. 1, the imaging element 11 is a CMOS (Complementary Metal Oxide Semiconductor) image sensor and has an OPB (Optical Black) region 13 provided so as to enclose the outer periphery of an effective pixel region 12 provided at a substantially central position thereof. Further, in the imaging element 11, the outer side of the OPB region 13 is determined as a peripheral region 14, and in the following description, the OPB region 13 and the peripheral region 14 are collectively referred to as effective pixel peripheral region 15.

The effective pixel region 12 is a region in which a plurality of pixels 17 (refer to B of FIG. 1) is disposed in a matrix, and light with which an image of an imaging object is formed by an optical system not depicted is received by each pixel 17 and a pixel signal for generating an image in which the imaging object is imaged is outputted.

The OPB region 13 is a region in which, when an image is generated on the basis of the pixel signal outputted from the effective pixel region 12, a photodiode 31 (refer to FIG. 1B) that outputs a pixel signal for defining the level of the black to be used as a reference is disposed.

The peripheral region 14 is a region in which a peripheral circuit for driving the pixels 17 provided in the effective pixel region 12, various wiring lines and so forth are formed. Further, as depicted in FIG. 1, a plurality of bonding pads 16 is formed in the peripheral region 14 along two sides (in the example of A of FIG. 1, the upper side and the lower side). Each of the bonding pads 16 is an electrode for electrically coupling the imaging element 11 to the outside and has, for example, a bonding wire bonded thereto.

Further, as depicted in B of FIG. 1, the imaging element 11 is configured by stacking a semiconductor substrate 21, a first flattening film 22, a color filter layer 23, a microlens layer 24, a light absorbing film 25, and a reflection preventing film 26.

The semiconductor substrate 21 is, for example, a wafer formed by thinly slicing a semiconductor block, for example, of silicon and has a plurality of photodiodes 31 formed thereon so as to correspond to the plurality of pixels 17 provided in the effective pixel region 12. Further, the plurality of photodiodes 31 is formed also in the OPB region 13 of the semiconductor substrate 21 similarly to the effective pixel region 12.

Further, an inter-pixel light blocking film 32, an OPB light blocking film 33, and wiring lines 34 and 35 are formed on the surface of the semiconductor substrate 21. The inter-pixel light blocking film 32 is disposed between the pixels 17 in the effective pixel region 12 and performs light blocking for preventing color mixing between the pixels 17 adjacent to each other. The OPB light blocking film 33 is disposed so as to cover the OPB region 13 and performs light blocking such that light is not irradiated upon the photodiodes 31 formed in the OPB region 13. The wiring lines 34 and 35 are used in a peripheral circuit provided in the peripheral region 14.

The first flattening film 22 fills up differences in level at end portions of the inter-pixel light blocking film 32, OPB light blocking film 33 and wiring lines 34 and 35 to flatten the surface.

In the color filter layer 23, a filter 36 that transmits light of a color corresponding to each pixel 17 is formed in the effective pixel region 12, and a light absorbing film 37 is formed in the effective pixel peripheral region 15. For example, as the filters 36 formed for the pixels 17 in the effective pixel region 12, in the primary color system, red, green, and blue are used, and in the complementary color system, yellow, cyan, and magenta are used. Thus, the pixels 17 receive light transmitted through the corresponding filters 36.

Further, a material to which a black pigment configured, for example, from carbon black, titanium black, iron oxide (magnetite-based triiron tetroxide), a complex oxide of copper and chromium, a complex oxide of copper, chrome, and zinc, or the like is internally added is used for the light absorbing film 37 formed on one face in the effective pixel peripheral region 15. It is to be noted that, to the light absorbing film 37, a pigment of at least one color from among pigments of the primary color system such as red, green, and blue, and a pigment of at least one color from among pigments of the complementary color system such as yellow, cyan, and magenta may be used similarly to the filter 36, and the light absorbing film 37 can be formed at the same time with the filters 36 of a color to be used. Alternatively, the light absorbing film 37 may be formed such that the filters 36 having the individual colors extend to the effective pixel peripheral region 15 in an array similar to that of the effective pixel region 12.

A plurality of microlens 38 that condenses light irradiated on the pixels 17 are formed in the microlens layer 24 for each of the pixels 17 provided in the effective pixel region 12. In this manner, by providing the microlens 38 for each pixel 17, an effective area that is effective for reception of light by the pixels 17 can be expanded, and the sensitivity characteristic of the imaging element 11 can be enhanced. It is to be noted that, in the microlens layer 24, the microlenses 38 similar to those in the effective pixel region 12 are formed for the individual photodiodes 31 also in the OPB region 13 in which the pixels 17 are not provided.

The light absorbing film 25 is formed from a material having a light absorbing property on the microlens layer 24 in the effective pixel peripheral region 15. For example, as the light absorbing film 25, a material to which a pigment of at least one color from among pigments of red, green, blue, yellow, cyan, and magenta is internally added can be used. Further, as the light absorbing film 25, a material to which a black pigment configured from carbon black, titanium black, iron oxide (magnetite-based triiron tetroxide), a complex oxide of copper and chromium, a complex oxide of copper, chrome, and zinc, or the like is internally added may be used.

Further, as indicated in a region surrounded by a broken line in B of FIG. 1, an edge portion of a pattern on which the light absorbing film 25 is to be formed is formed as an angular portion (for example, the angle θ is 95° or less) as viewed in a cross section. For example, by using a photo-setting type negative resist as such a material composition as described above, the light absorbing film 25 is formed such that the edge portion has an angular portion in a cross section. In particular, the edge portion of the photo-setting type negative resist is liable to become, when pattern exposure is performed by exposure, an angular portion as photosetting progresses from the surface of the material.

The reflection preventing film 26 is a film formed from a material having a lower refractive index than those of the microlens layer 24 of the effective pixel region 12 and the light absorbing film 25 in the effective pixel peripheral region 15, and is formed over the overall area on the microlens layer 24 and the light absorbing film 25. For example, the reflection preventing film 26 prevents reflection of light by the surface. It is to be noted that an opening that is open at a location at which a bonding pad 16 is provided and is for bonding a bonding wire to the bonding pad 16 is provided on the reflection preventing film 26.

Here, the reflection preventing film 26 has a porous (porous) film property from its formation temperature and has a nature that it is vulnerable to stress. Therefore, if stress is applied to the imaging element 11 in heat treatment upon mounting on a printed board or the like, then a crack is likely to occur from an opening provided corresponding to a bonding pad 16 in the reflection preventing film 26. For example, a crack occurring in the reflection preventing film 26 from an opening provided corresponding to a bonding pad 16 sometimes reaches the effective pixel region 12, and in this case, it deteriorates the picture quality of an image to be imaged by the imaging element 11.

Therefore, in the imaging element 11, an edge portion of a pattern in which the light absorbing film 25 is formed is not shaped gently but is shaped such that it has an angular portion (angle θ≤95°) that is substantially orthogonal to the flattened face. Consequently, in the imaging element 11, a crack occurring in the reflection preventing film 26 is prevented from progressing to the effective pixel region 12 by an effect of the angle at the edge portion of the light absorbing film 25.

In this manner, the imaging element 11 is configured such that, in the effective pixel peripheral region 15, the light absorbing film 37 is provided on the color filter layer 23 and the light absorbing film 25 is formed on the microlens layer 24. In other words, the imaging element 11 is configured such that the light absorbing film 25 and the light absorbing film 37 are formed individually in different layers such that they overlap with each other as viewed in plan.

Consequently, in the imaging element 11, for example, the OD (Optical Density) value of each of the light absorbing film 25 and the light absorbing film 37 can be adjusted to a range within which an error in alignment when positioning is performed does not occur. For example, it is possible to form the light absorbing film 37 so as to adjust the transmission amount of light to a level with which an alignment mark formed on the semiconductor substrate 21 can be confirmed such that alignment at a succeeding step is performed with certainty. Thereafter, when the light absorbing film 25 is formed separately from the light absorbing film 37, the transmission amount of light can be adjusted by the two overlapping layers such that reflection of light incident to the effective pixel peripheral region 15 is prevented.

Accordingly, in the imaging element 11, light incident to the effective pixel peripheral region 15 is absorbed with certainty by the light absorbing film 25 and the light absorbing film 37, and the light can be prevented from being reflected by the semiconductor substrate 21 to make stray light. Consequently, the imaging element 11 can effectively suppress flare, ghost, and so forth arising from such stray light and can image an image of high picture quality free from flare, ghost, or the like.

It is to be noted that, for example, in the case where the imaging element 11 is configured such that only the light absorbing film 37 is used to prevent reflection of light incident to the effective pixel peripheral region 15, it is necessary to increase the thickness of the light absorbing film 37. Accordingly, in this case, since coating unevenness is likely to occur with the microlens layer 24 and the reflection preventing film 26 stacked on the light absorbing film 37, deterioration of the picture quality is worried. Further, since increase of the thickness increases the OD value of the light absorbing film 37, a failure occurs in alignment when positioning is performed. In contrast, since the imaging element 11 uses the light absorbing film 25 and the light absorbing film 37 in combination, the thickness of the light absorbing film 37 is not increased, and occurrence of such coating unevenness or occurrence of a failure in alignment upon positioning can be avoided. Accordingly, stable fabrication of the imaging element 11 while deterioration of the picture quality is not worried becomes possible.

Further, in the imaging element 11, by forming an edge portion of a pattern in which the light absorbing film 25 is formed so as to have an angular portion, a crack occurring in the reflection preventing film 26 can be prevented from progressing to the effective pixel region 12, and deterioration of the picture quality by such crack can be avoided.

<Fabrication Method of Imaging Element>

A fabrication method of the imaging element 11 is described with reference to FIGS. 2 to 4.

First, in the first step, an inter-pixel light blocking film 32, an OPB light blocking film 33, and wiring lines 34 and 35 are formed on a front face of a semiconductor substrate 21 on which a plurality of photodiodes 31 is formed as depicted in the upper part of FIG. 2.

In the second step, a first flattening film 22 is formed so as to fill up differences in level at end portions of the inter-pixel light blocking film 32, OPB light blocking film 33, and wiring lines 34 and 35 on the surface of the semiconductor substrate 21 to flatten the end portions as depicted in the middle part of FIG. 2. The first flattening film 22 is formed, for example, by spin coating material such as, for example, acrylic thermosetting resin and performing heat treatment to harden the material.

In the third step, a color filter layer 23 is formed so as to be stacked on the first flattening film 22 as depicted in the lower part of FIG. 2. The color filter layer 23 is formed, in the effective pixel region 12, from a filter 36 of a color corresponding to each photodiode 31 and is formed, in the effective pixel peripheral region 15, from a light absorbing film 37 made of material to which such pigment of the black, complementary, or primary color system as described above is internally added.

Figure 3:
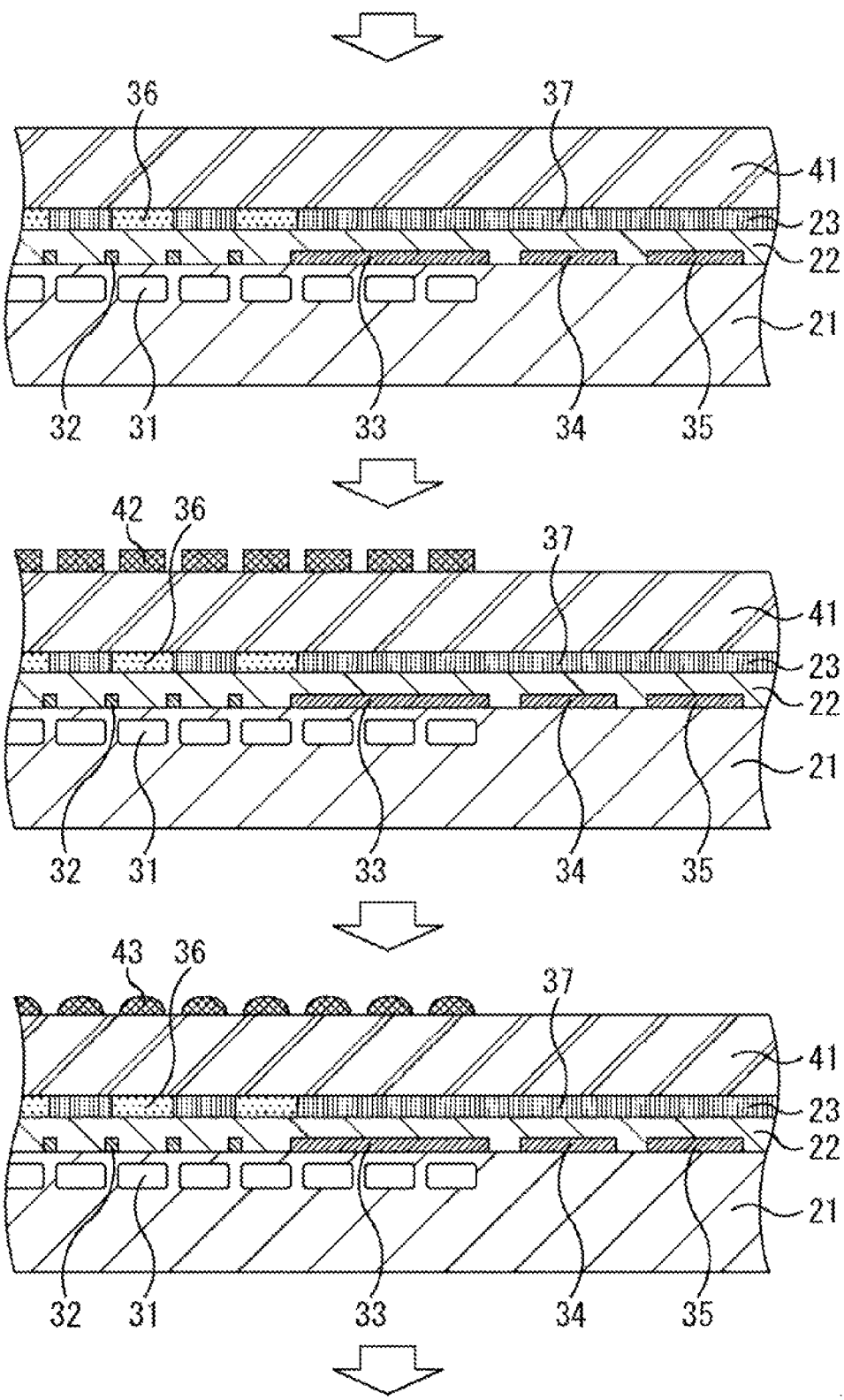
FIG. 3 is a view illustrating fourth to sixth steps.

Then, in the fourth step, a microlens material film 41 is formed so as to be stacked on the color filter layer 23 as depicted in the upper part of FIG. 3. The microlens material film 41 is formed, for example, by spin coating polystyrene, acrylic or like material or copolymer-based thermosetting resin of such materials and then performing heat treatment to harden the material.

In the fifth step, photoresist patterns 42 of the positive type are formed corresponding to locations at which the photodiodes 31 are disposed so as to be stacked on the microlens material film 41 as depicted in the middle part of FIG. 3. The photoresist patterns 42 are formed, for example, by spin coating and prebaking resist material having photosensitivity, exposing the resist material in response to patterns of the photodiodes 31 and then performing a development process.

In the sixth step, such processing as to form microlens base material patterns 43 from the photoresist patterns 42 is performed as depicted in the lower part of FIG. 3. For example, by carrying out heat reflow by heat treatment to a temperature equal to or higher than the heat softening point of the photoresist patterns 42 for the photoresist patterns 42, the microlens base material pattern 43 according to the shape of the microlenses 38 is formed.

Figure 4:
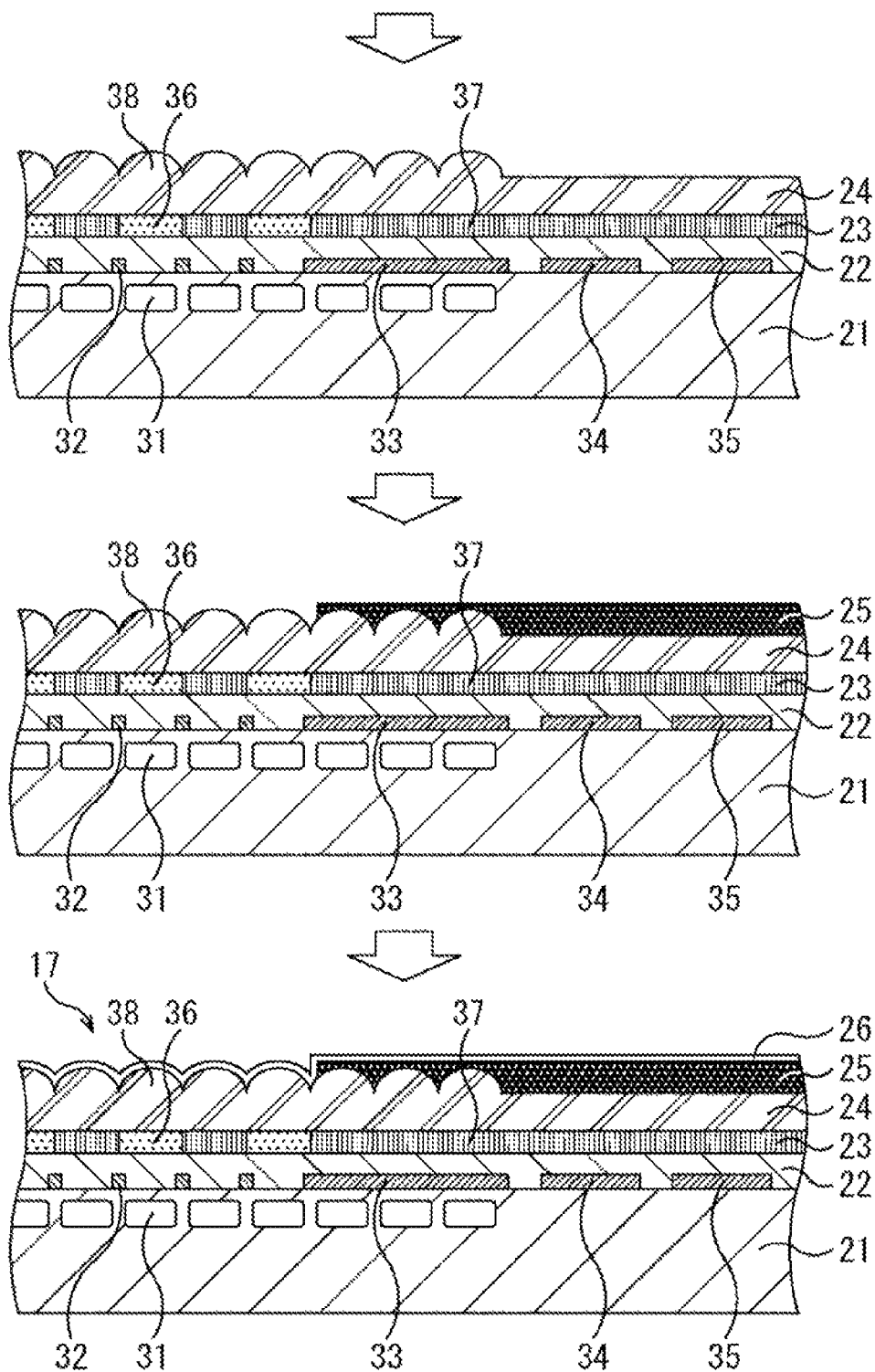
FIG. 4 is a view illustrating seventh to ninth steps.

Then, in the seventh step, a microlens layer 24 on which microlenses 38 are formed for the individual photodiodes 31 is formed as depicted in the upper part of FIG. 4. For example, for the microlens base material patterns 43 processed to the shape of microlenses and the microlens material film 41 formed as the ground for the microlens base material patterns 43, a dry etching process using fluorocarbon-based gas or the like is performed. By the process, the microlens base material patterns 43 are transferred by the etching method such that the effective area of the microlenses is expanded to form microlenses 38 in the microlens layer 24.

In the eighth step, a light absorbing film 25 is formed in the effective pixel peripheral region 15 as depicted in the middle part of FIG. 4. At this time, a pattern edge portion of the light absorbing film 25 is formed so as to form an angular portion as viewed in cross section as described hereinabove.

In the ninth step, a reflection preventing film 26 is formed over an overall area of the microlens layer 24 and the light absorbing film 25 as depicted in the lower part of FIG. 4. For example, a silicon oxide film is used for the reflection preventing film 26, and in the formation of the silicon oxide film, heat of approximately 180° C. to 220° C. is used taking the heat resisting property of the first flattening film 22, color filter layer 23, microlens layer 24 and so forth into consideration.

Through such steps as described above, an imaging element 11 can be fabricated in which a plurality of microlenses 38 is formed corresponding to the pixels 17 in the effective pixel region 12 and a light absorbing film 25 is formed on the microlens layer 24 in the effective pixel peripheral region 15 and besides a reflection preventing film 26 is formed on the microlenses 38 and the light absorbing film 25. Consequently, as described above, the imaging element 11 can be fabricated with higher quality in which reflection of light in the effective pixel peripheral region 15 is prevented and occurrence of coating unevenness or failure in alignment in positioning are avoided and besides cracking of the reflection preventing film 26 can be prevented from progressing to the effective pixel region 12.

<Second Configuration Example of Imaging Element>

A second embodiment of the imaging element to which the present technology is applied is described with reference to FIG. 5.

Figure 5:
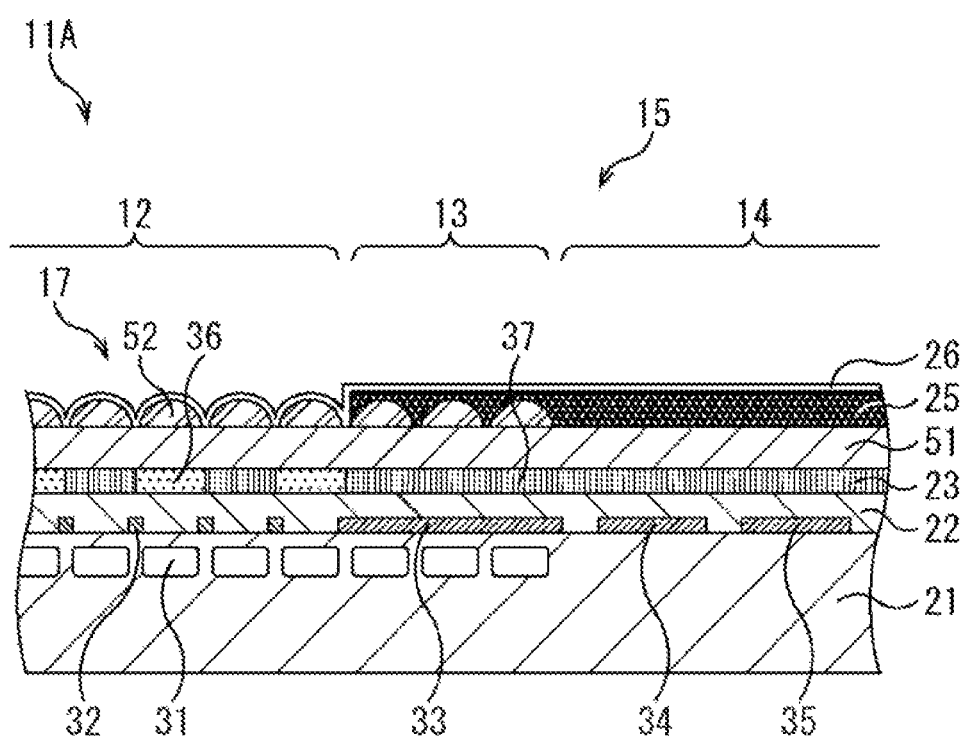
FIG. 5 is a view depicting an example of a configuration of a second embodiment of the imaging element.

FIG. 5 depicts an a-a' cross section of an imaging element 11A similarly to B of FIG. 1. Components of the imaging element 11A depicted in FIG. 5 common to those of the imaging element 11 of FIG. 1 are denoted by the same reference signs, and detailed description of them is omitted.

For example, while, in the imaging element 11 of FIG. 1, the microlenses 38 are formed by a dry etching method as described hereinabove, the imaging element 11A has a configuration different in that microlenses 52 are formed by a heat reflow method.

In particular, the imaging element 11A includes a semiconductor substrate 21, a first flattening film 22, a color filter layer 23, a light absorbing film 25, and a reflection preventing film 26 that are configured similarly to those of the imaging element 11 of FIG. 1. On the other hand, the imaging element 11A has a configuration different from the imaging element 11 of FIG. 1 in that a second flattening film 51 is formed on the color filter layer 23 and microlenses 52 are formed so as to be stacked on the second flattening film 51.

The second flattening film 51 is formed, for example, in order to flatten the surface of the filters 36 disposed for the individual pixels 17.

The microlenses 52 are formed individually for the pixels 17 provided in the effective pixel region 12 such that they condense light to be irradiated upon the pixels 17 similarly to the microlenses 38 of FIG. 1. For example, the microlenses 52 are formed by performing heat reflow for photosensitive microlens material patterns 53 of FIG. 6 hereinafter described. It is to be noted that, in the imaging element 11A, the layer in which the microlenses 52 are formed is a microlens layer.

The imaging element 11A configured in such a manner as described above can prevent reflection of light in the effective pixel peripheral region 15 and avoid occurrence of coating unevenness, and can prevent a crack in the reflection preventing film 26 from progressing to the effective pixel region 12 similarly to the imaging element 11 of FIG. 1. Consequently, the imaging element 11A can image an image of high picture quality, for example, free from flare, ghost, or the like.

<Fabrication Method of Imaging Element>

A fabrication method of the imaging element 11A is described with reference to FIGS. 6 and 7.

Figure 6:
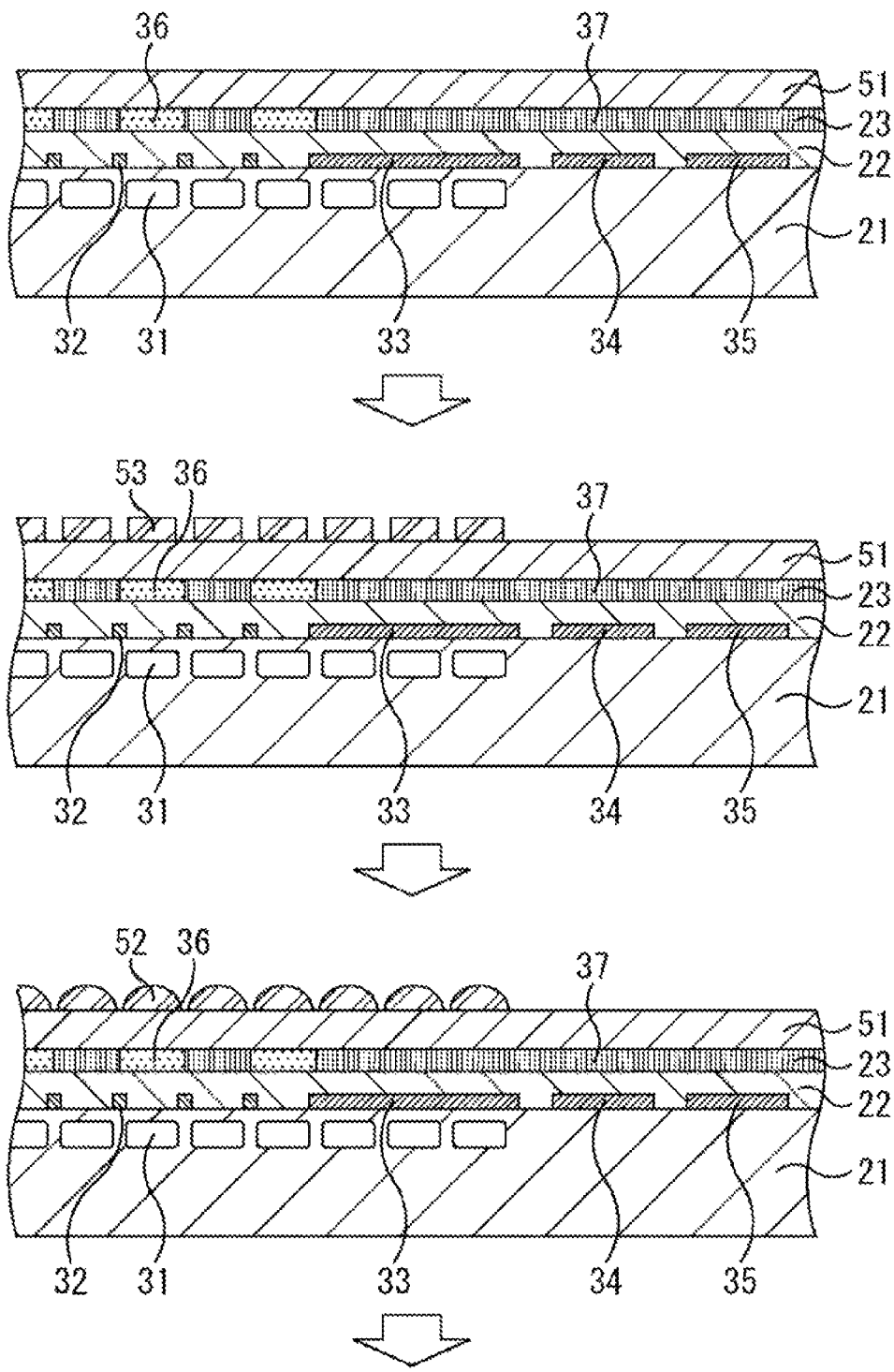
FIG. 6 is a view illustrating eleventh to thirteenth steps.

First, after up to a color filter layer 23 is formed by processes similar to those in the first to third steps described above (refer to FIG. 2), in the eleventh step, a second flattening film 51 is formed so as to flatten the color filter layer 23 as depicted in the upper part in FIG. 6. The second flattening film 51 is formed, for example, by spin coating material such as, for example, acrylic thermosetting resin and performing heat treatment to harden the material.

In the twelfth step, photosensitive microlens material patterns 53 are formed corresponding to locations at which the photodiodes 31 are disposed such that they are stacked on the second flattening film 51 as depicted in the middle part of FIG. 6. The photosensitive microlens material patterns 53 is formed, for example, by spin coating and pre-baking photoresist of the positive type, exposing the photoresist in accordance with the patterns for the photodiodes 31 to perform bleaching exposure (a descent rate enhancing process for the photosensitive material by photodecomposition) in order to enhance light transmission rate of visible light short-wavelength and then performing a development process.

In the thirteenth step, such processing as to form microlenses 52 from the photosensitive microlens material patterns 53 is performed as depicted in the lower part of FIG. 6. The microlenses 52 are formed, for example, by carrying out heat reflow by heat treatment to a temperature equal to or higher than the heat softening point of the photosensitive microlens material patterns 53 for the photosensitive microlens material patterns 53.

Figure 7:
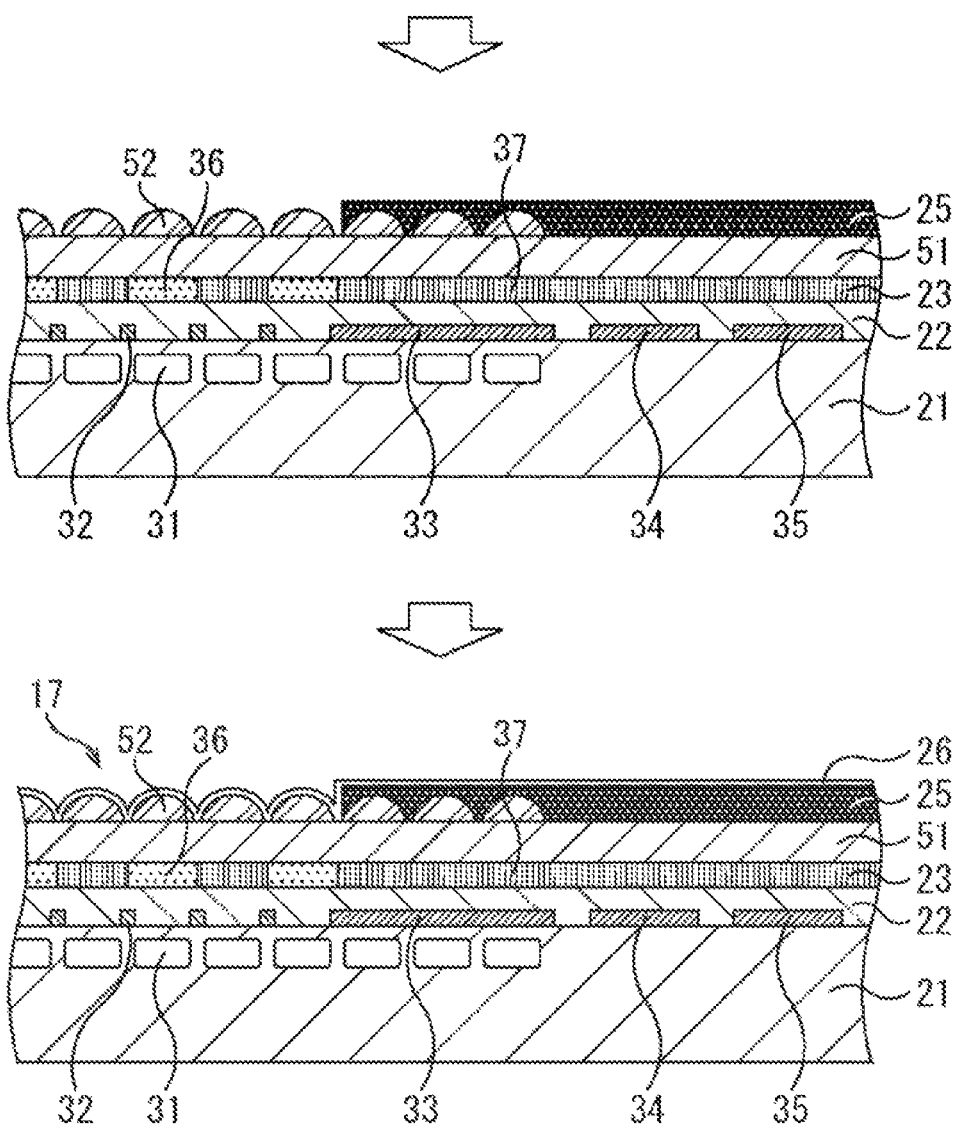
FIG. 7 is a view illustrating fourteenth and fifteenth steps.

Then, in the fourteenth step, a light absorbing film 25 is formed in the effective pixel peripheral region 15 as depicted in the upper part of FIG. 7. At this time, a pattern edge portion of the light absorbing film 25 is formed so as to have an angular portion as viewed in cross section similarly to the imaging element 11 of FIG. 1.

In the fifteenth step, a reflection preventing film 26 is formed over an overall area of the microlenses 52 and the light absorbing film 25 as depicted in the lower part of FIG. 7.

By such steps as described above, an imaging element 11A of higher quality can be fabricated similarly to the imaging element 11 of FIG. 1.

<Third Configuration Example of Imaging Element>

A third embodiment of the imaging element to which the present technology is applied is described with reference to FIG. 8.

Figure 8:
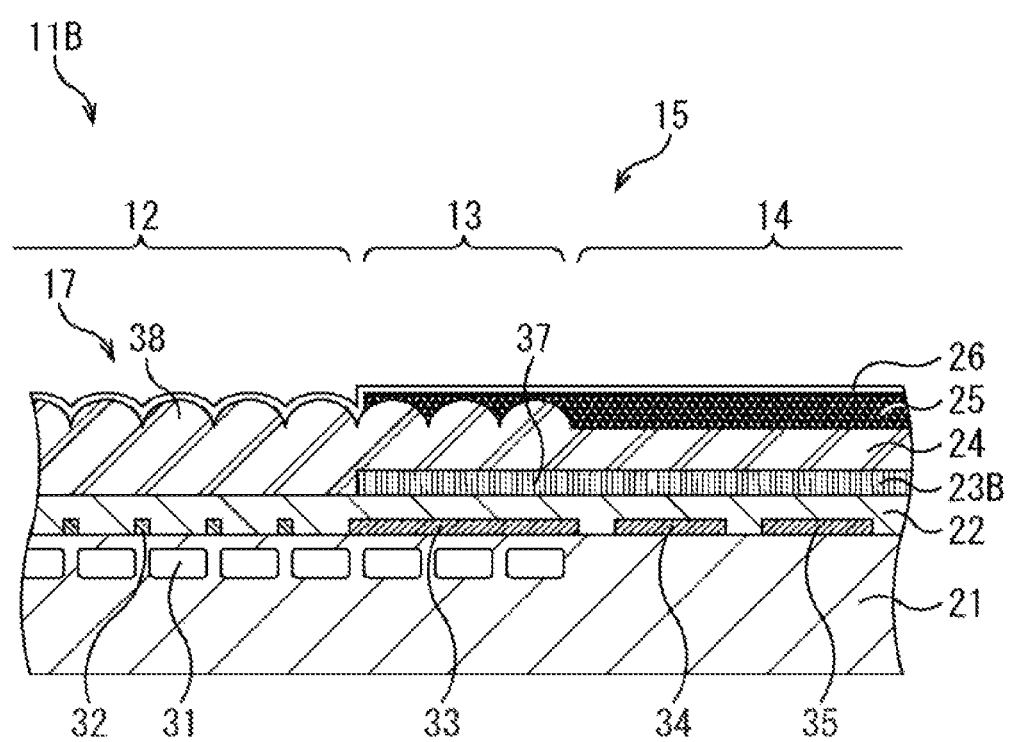
FIG. 8 is a view depicting an example of a configuration of a third embodiment of the imaging element.

FIG. 8 depicts an a-a' cross section of an imaging element 11B similarly to B of FIG. 1. Further, in the imaging element 11B depicted in FIG. 8, components common to those of the imaging element 11 of FIG. 1 are denoted by the same reference signs, and detailed description of them is omitted.

In particular, the imaging element 11B is configured such that a semiconductor substrate 21, a first flattening film 22, a microlens layer 24, a light absorbing film 25, and a reflection preventing film 26 are stacked similarly to the imaging element 11 of FIG. 1. On the other hand, the imaging element 11B is different from the imaging element 11 of FIG. 1 in the configuration of a color filter layer 23B.

In particular, as depicted in FIG. 8, the color filter layer 23B of the imaging element 11B is configured such that a light absorbing film 37 is formed in the effective pixel peripheral region 15 and the filters 36 of FIG. 1 are not provided. In short, the imaging element 11B is configured such that the pixels 17 can receive light in all wavelength range and output a pixel signal according to the luminance of the received light.

Further, similarly as in the imaging element 11 of FIG. 1, in the imaging element 11B, light incident to the effective pixel peripheral region 15 is absorbed with certainty by the light absorbing film 25 and the light absorbing film 37 thereby to prevent the light from being reflected by the semiconductor substrate 21 to make stray light. Accordingly, the imaging element 11B can image an image of high picture quality free from flare, ghost, or the like similarly to the imaging element 11 of FIG. 1.

Further, the imaging element 11B configured in this manner not only can be used, for example, in an imaging apparatus that acquires only luminance information of an imaging object but also can be used in an imaging apparatus that includes a plurality of imaging elements 11B utilizing a light decomposition prism that decomposes a light flux into a plurality of light fluxes.

<Configuration Example of Imaging Apparatus Utilizing Light Decomposition Prism>

Figure 9:
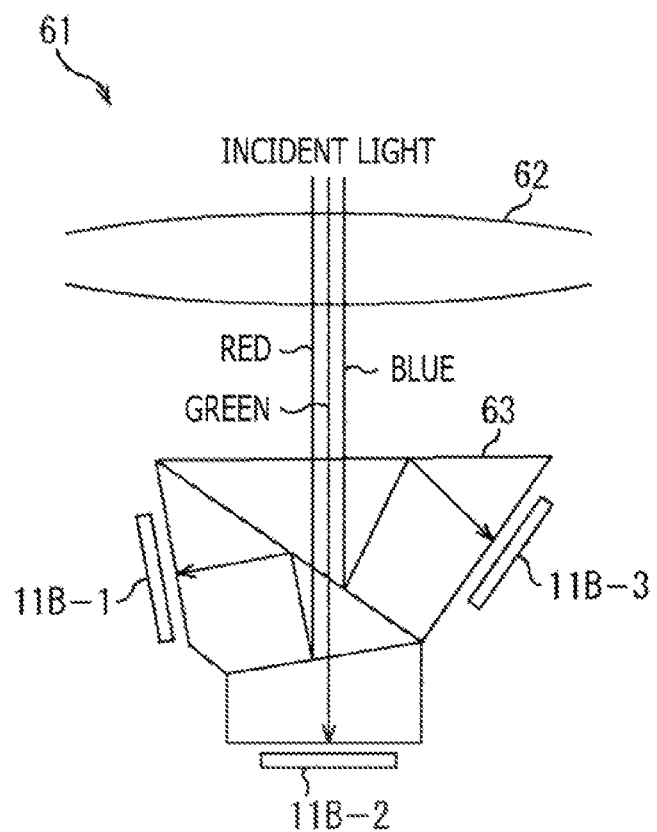
FIG. 9 is a view depicting an example of a configuration of an imaging apparatus in which a light decomposition prism is utilized.

FIG. 9 depicts a schematic configuration example of an imaging apparatus that utilizes a light decomposition prism.

As depicted in FIG. 9, an imaging apparatus 61 includes an objective lens 62, a light decomposition prism 63, and imaging elements 11B-1 to 11B-3.

The objective lens 62 condenses incident light incident to the imaging apparatus 61 to form an image of an imaging object on a light reception face of the imaging elements 11B-1 to 11B-3.

The light decomposition prism 63 is configured such that it transmits only light in a specific wavelength range but reflects light outside the wavelength range and spectralizes incident light, for example, into light of red, green, and blue. For example, the light decomposition prism 63 transmits light in the wavelength range of green so as to be received by the imaging element 11B-2, reflects light in the wavelength range of red so as to be received by the imaging element 11B-1 and reflects light in the wavelength range of blue so as to be received by the imaging element 11B-3.

It is supposed that, in the imaging apparatus 61 configured in this manner, in the case where light is reflected in the effective pixel peripheral region 15 of the imaging elements 11B-1 to 11B-3, the light is re-reflected in the light decomposition prism 63 and enters as stray light into the effective pixel region 12 of the imaging elements 11B. In the related art, such stray light makes flare, ghost, or the like and becomes a cause that gives rise to deterioration of the picture quality.

In contrast, since the imaging elements 11B-1 to 11B-3 are configured such that reflection of light in the effective pixel peripheral region 15 is suppressed, incidence of stray light through the light decomposition prism 63 is avoided, and as a result, an image of high picture quality free from flare, ghost, or the like can be imaged.

<Fourth Configuration Example of Imaging Element>

A fourth embodiment of the imaging element to which the present technology is applied is described with reference to FIG. 10.

Figure 10:
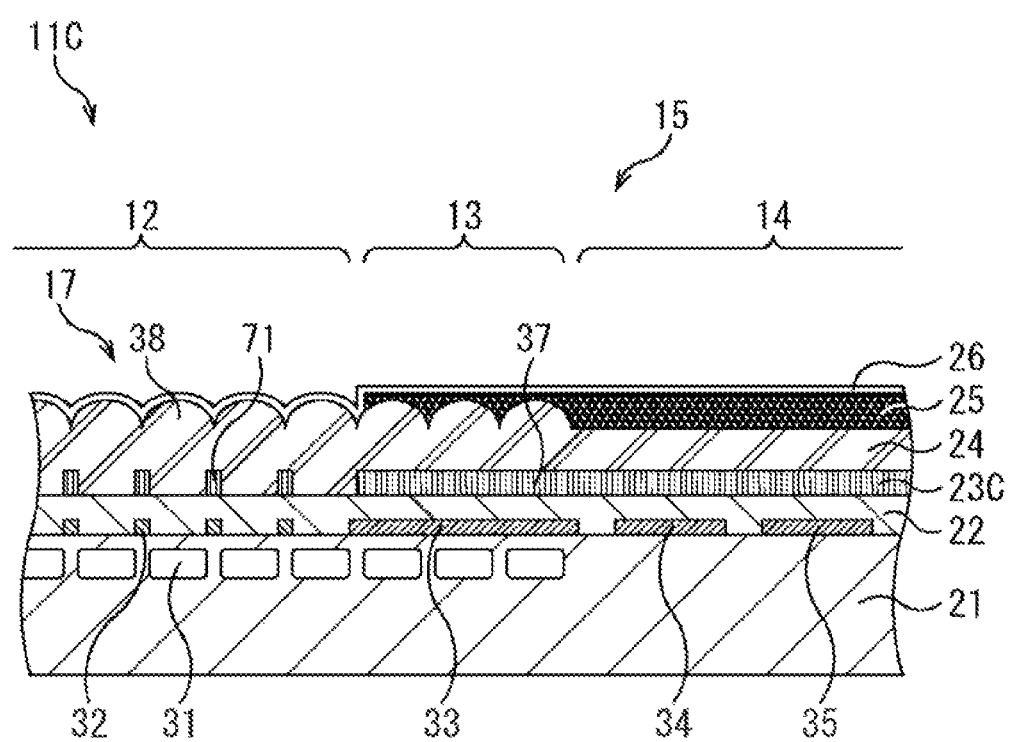
FIG. 10 is a view depicting an example of a configuration of a fourth embodiment of the imaging element.

FIG. 10 depicts an a-a' cross section of an imaging element 11C similarly so B of FIG. 1. Components of the imaging element 11C depicted in FIG. 10 common to those of the imaging element 11 of FIG. 1 are denoted by the same reference signs, and detailed description of them is omitted.

In particular, the imaging element 11C is formed by stacking a semiconductor substrate 21, a first flattening film 22, a microlens layer 24, a light absorbing film 25, and a reflection preventing film 26 similarly to the imaging element 11 of FIG. 1. On the other hand, the imaging element 11C is different in configuration of a color filter layer 23C from the imaging element 11 of FIG. 1.

In particular, as depicted in FIG. 10, the color filter layer 23C of the imaging element 11C is configured such that a light absorbing film 37 is formed in the effective pixel peripheral region 15 and an inter-pixel light blocking film 71 is formed without the provision of the filter 36 of FIG. 1.

The inter-pixel light blocking film 71 is disposed between the pixels 17 (at a boundary portion between the pixels 17) in the effective pixel region 12 and performs blocking of light for preventing color mixture between the pixels 17 adjacent to each other similarly to the inter-pixel light blocking film 32. Further, as the inter-pixel light blocking film 71, an organic material to which a black pigment configured, for example, from carbon black, titanium black, iron oxide (magnetite-based triiron tetroxide), a complex oxide of copper and chromium, a complex oxide of copper, chrome, and zinc, or the like is internally added is used similarly to the light absorbing film 37.

Thus, in the imaging element 11C, light incident to the effective pixel peripheral region 15 is absorbed with certainty by the light absorbing film 25 and the light absorbing film 37, and the light can be prevented from being reflected by the semiconductor substrate 21 to make stray light similarly as in the imaging element 11 of FIG. 1. Accordingly, the imaging element 11C can image an image of high picture quality free from flare, ghost, or the like similarly to the imaging element 11 of FIG. 1.

<Fifth Configuration Example of Imaging Element>

A fifth embodiment of the imaging element to which the present technology is applied is described with reference to FIG. 11.

Figure 11:
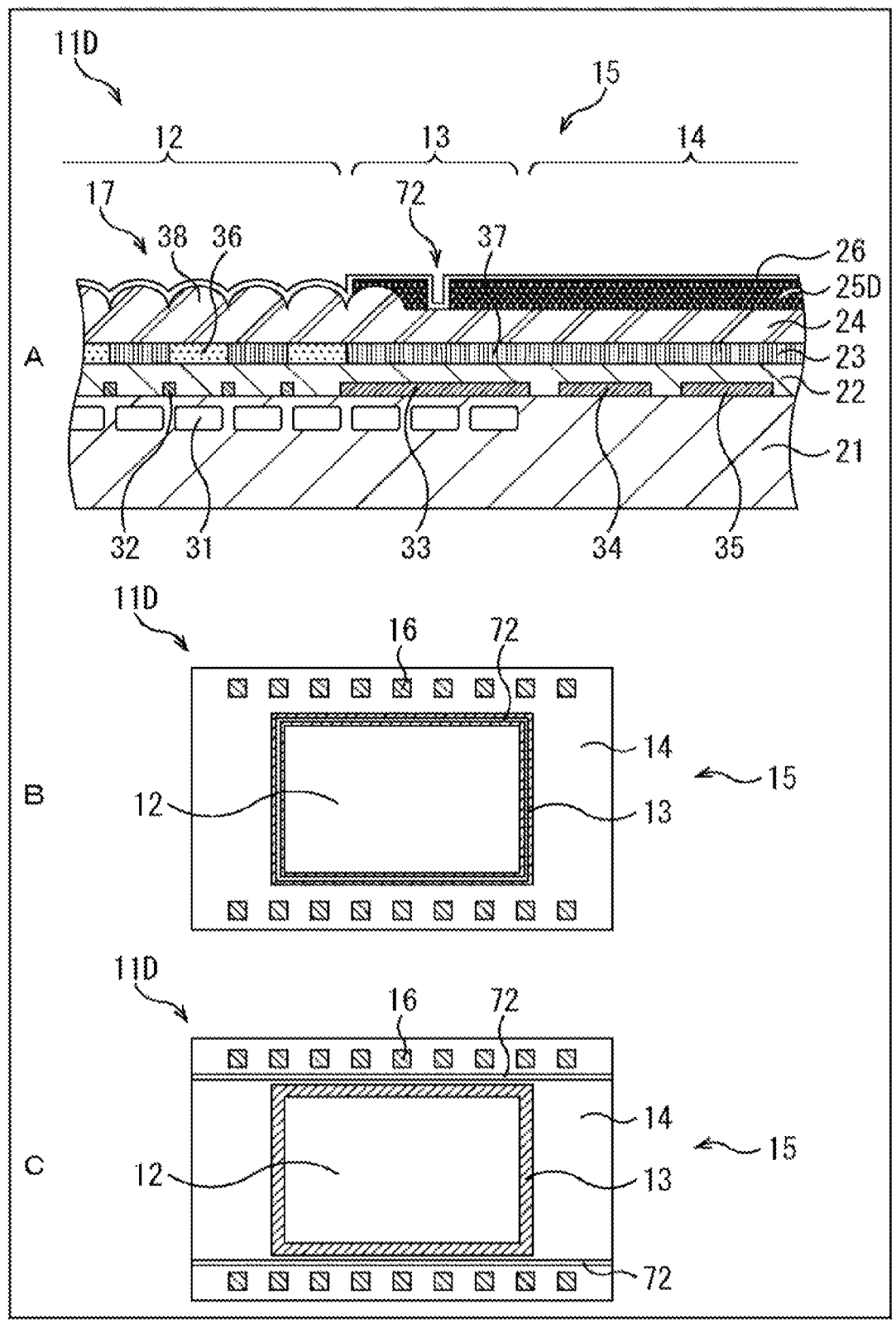
FIG. 11 is a view depicting an example of a configuration of a fifth embodiment of the imaging element.

A of FIG. 11 depicts an a-a' cross section of an imaging element 11D similarly as in B of FIG. 1, and in B of FIG. 11 and C of FIG. 11, layout examples of a grooved portion 72 hereinafter described are depicted. Components of the imaging element 11D depicted in FIG. 11 common to those of the imaging element 11 of FIG. 1 are denoted by the same reference signs, and detailed description of them is omitted.

In particular, the imaging element 11D is configured by stacking a semiconductor substrate 21, a first flattening film 22, a color filter layer 23, a microlens layer 24, and a reflection preventing film 26 similarly to the imaging element 11 of FIG. 1. Meanwhile, the imaging element 11B is different from the imaging element 11 of FIG. 1 in configuration of a light absorbing film 25D.

In particular, as depicted in FIG. 11, the light absorbing film 25D of the imaging element 11D is configured such that the grooved portion 72 is formed in the effective pixel peripheral region 15. The grooved portion 72 is formed such that it divides the effective pixel region 12 and the bonding pads 16 formed in the peripheral region 14 from each other.

For example, as depicted in B of FIG. 11, the grooved portion 72 can be formed such that it encloses the effective pixel region 12 along an outer periphery of the effective pixel region 12. As an alternative, as depicted in C of FIG. 11, two grooved portions 72 may be formed along the upper side and the lower side of the effective pixel region 12.

By providing the grooved portion 72 on the light absorbing film 25D in this manner, in the imaging element 11D, an angular portion is formed at the opposite ends of the grooved portion 72 as viewed in cross section, and a reflection preventing film 26 is formed along the surface shape of the same. Accordingly, in the case where a crack is generated from an opening provided corresponding to a bonding pad 16 as described hereinabove, the crack can be prevented from progressing to the effective pixel region 12 by an effect of the angle at an edge portion of the grooved portion 72 of the light absorbing film 25D.

In particular, the imaging element 11D can improve, compared with the imaging element 11 of FIG. 1, the effect of preventing a crack generated on the reflection preventing film 26 from progressing to the effective pixel region 12, and can avoid deterioration of the picture quality by the crack with certainty.

<Sixth Configuration Example of Imaging Element>

A sixth embodiment of the imaging element to which the present technology is applied is described with reference to FIG. 12.

Figure 12:
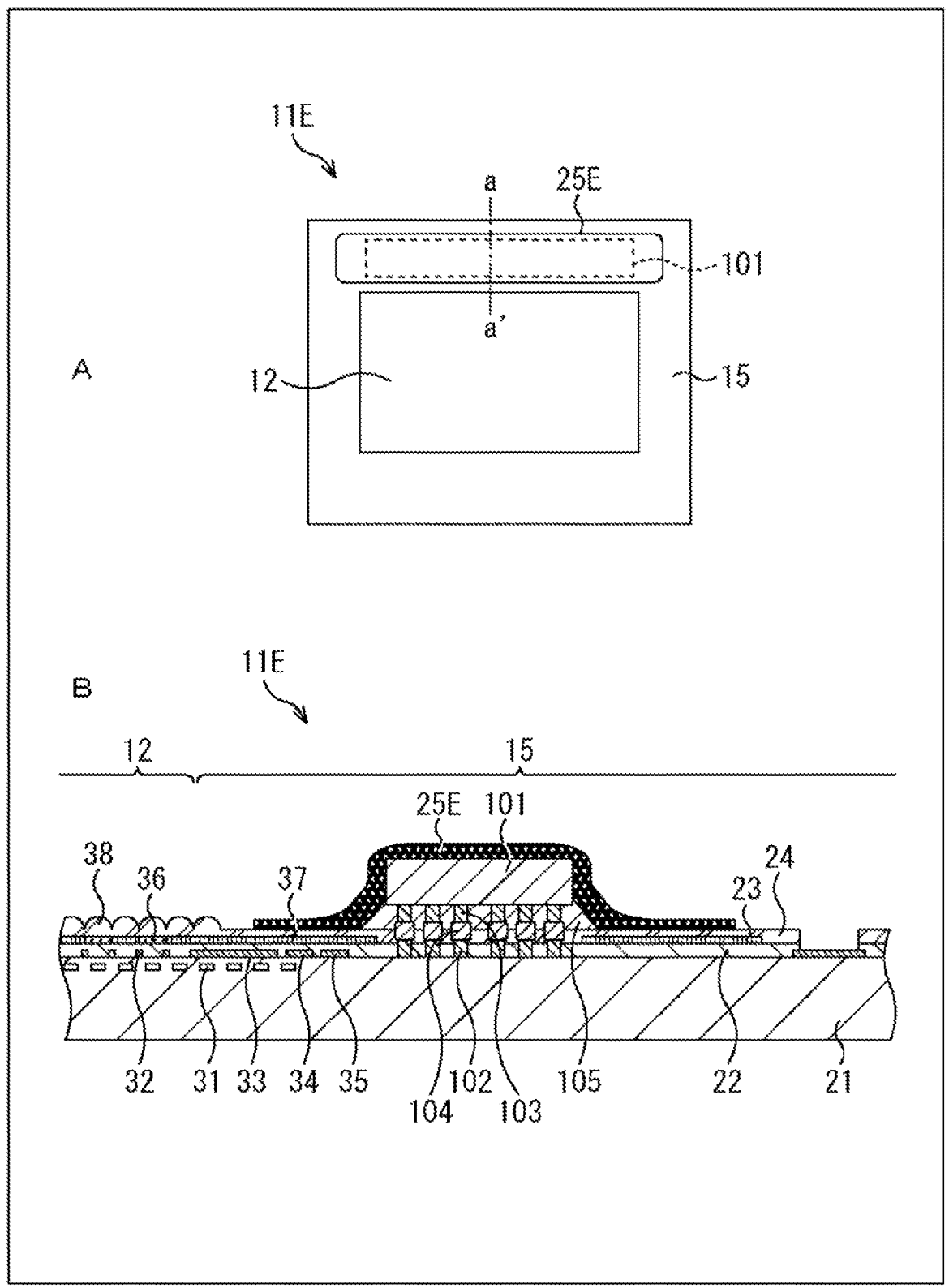
FIG. 12 is a view depicting an example of a configuration of a sixth embodiment of the imaging element.

A of FIG. 12 depicts a schematic configuration when an imaging element 11E is viewed in plan similarly to A of FIG. 1, and B of FIG. 12 depicts an a-a' cross section of the imaging element 11E similarly so B of FIG. 1. Further, components of the imaging element 11E depicted in FIG. 12 common to those of the imaging element 11 of FIG. 1 are denoted by the same reference signs, and detailed description of them is omitted.

In particular, the imaging element 11E is configured by stacking a semiconductor substrate 21, a first flattening film 22, and a microlens layer 24 similarly to the imaging element 11 of FIG. 1. It is to be noted that, in FIG. 12, for example, illustration of the OPB region 13 and the peripheral region 14 depicted in FIG. 1 is omitted, and they are collectively depicted as an effective pixel peripheral region 15, and illustration also of the reflection preventing film 26 is omitted.

For example, in the imaging element 11E, a semiconductor element 101 is mounted on a semiconductor substrate 21 in the effective pixel peripheral region 15. For example, the semiconductor element 101 is mounted by electrically connecting a plurality of land electrodes 102 formed on the semiconductor substrate 21 side and a plurality of land electrodes 103 formed on the semiconductor element 101 side individually through solder bumps 104. Further, the semiconductor element 101 is adhered by underfill resin 105 filled between the semiconductor element 101 and the microlens layer 24.

Further, as depicted in B of FIG. 12, in the imaging element 11E, a light absorbing film 25E is formed so as to cover the semiconductor element 101. In particular, the light absorbing film 25E is formed such that it includes side faces of the semiconductor element 101 and covers an overall area of the upper face of the semiconductor element 101. Further, the light absorbing film 25E is formed so as to cover the underfill resin 105 and extend over the microlens layer 24.

The imaging element 11E is configured in this manner and can suppress reflected light in the effective pixel peripheral region 15 by the light absorbing film 25E. Consequently, for example, where the imaging element 11E is used in combination with such a light decomposition prism 63 as described above with reference to FIG. 9, re-reflected light that is generated in the light decomposition prism 63 or light incident as stray light to the effective pixel region 12 of the imaging element 11E can be reduced. As a result, an image of high picture quality free from flare, ghost, or the like can be imaged by the imaging element 11E.

Figure 13:
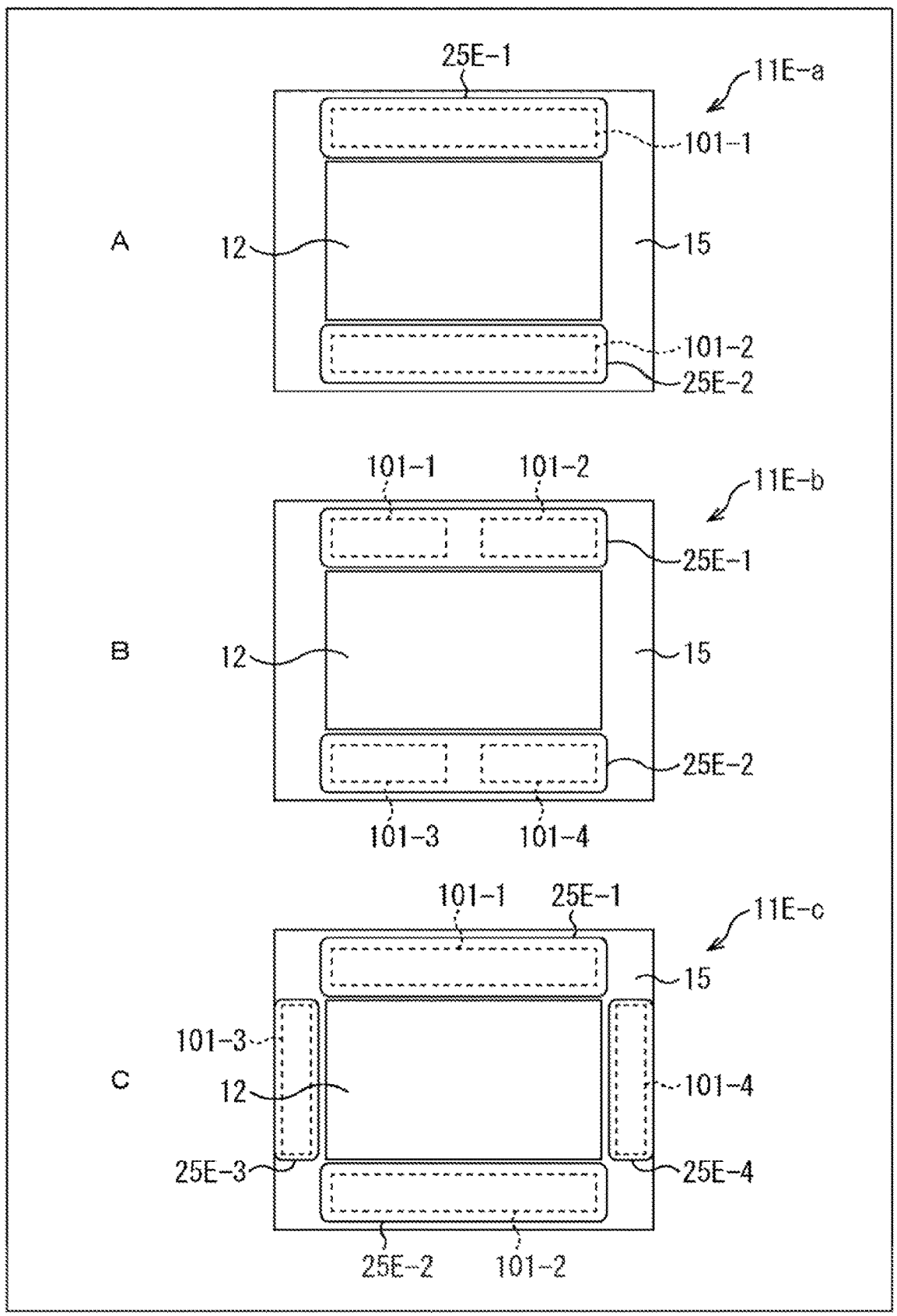
FIG. 13 is a view illustrating a modification of the imaging element of FIG. 12.

FIG. 13 depicts first to third modifications of the imaging element 11E.

For example, an imaging element 11E-a that is the first modification depicted in A of FIG. 13 is configured such that two semiconductor elements 101-1 and 101-2 are mounted in the effective pixel peripheral region 15. In particular, the imaging element 11E-a is configured such that the semiconductor element 101-1 is disposed along the upper long side of the effective pixel region 12 and the semiconductor element 101-2 is disposed along the lower long side of the effective pixel region 12.

Further, in the imaging element 11E-a, a light absorbing film 25E-1 is formed so as to cover the semiconductor element 101-1, and a light absorbing film 25E-2 is formed so as to cover the semiconductor element 101-2. At this time, as depicted in B of FIG. 12, the light absorbing film 25E-1 is formed such that it includes side faces of the semiconductor element 101-1 and covers an overall area of the upper face of the semiconductor element 101-1. Similarly, the light absorbing film 25E-2 is formed such that it includes side faces of the semiconductor element 101-2 and covers an overall area of the upper face of the semiconductor element 101-2.

Also in the imaging element 11E-a of such a configuration as describe above, reflected light in the effective pixel peripheral region 15 can be suppressed, and an image of high picture quality free from flare, ghost, or the like can be imaged similarly to the imaging element 11E.

Meanwhile, an imaging element 11E-b of the second modification depicted in B of FIG. 13 is configured such that four semiconductor elements 101-1 to 101-4 are mounted in the effective pixel peripheral region 15. In particular, in the imaging element 11E-b, the two semiconductor elements 101-1 and 101-2 are disposed side by side in a direction along the upper long side of the effective pixel region 12, and the two semiconductor elements 101-3 to 101-4 are disposed side by side in a direction along the lower long side of the effective pixel region 12.

Further, in the imaging element 11E-b, a light absorbing film 25E-1 is formed so as to cover the semiconductor elements 101-1 and 101-2 and a light absorbing film 25E-2 is formed so as to cover the semiconductor elements 101-3 to 101-4. At this time, as depicted in B of FIG. 12, the light absorbing film 25E-1 is formed such that it includes side faces of the semiconductor elements 101-1 and 101-2 and covers an overall area of the upper face of the semiconductor elements 101-1 and 101-2. Similarly, the light absorbing film 25E-2 is formed so as to include side faces of the semiconductor elements 101-3 to 101-4 and cover an overall area of the upper face of the semiconductor elements 101-3 to 101-4.

Also in the imaging element 11E-b of such a configuration as describe above, reflected light in the effective pixel peripheral region 15 can be suppressed, and an image of high picture quality free from flare, ghost, or the like can be imaged similarly to the imaging element 11E.

Further, an imaging element 11E-c that is a third modification depicted in C of FIG. 13 is configured such that four semiconductor elements 101-1 to 101-4 are mounted in the effective pixel peripheral region 15. In particular, in the imaging element 11E-c, the semiconductor element 101-1 is disposed along the upper long side of the effective pixel region 12, and the semiconductor element 101-2 is disposed along the lower long side of the effective pixel region 12. Further, the imaging element 11E-c is configured such that the semiconductor element 101-3 is disposed along the left short side of the effective pixel region 12 and the semiconductor element 101-4 is disposed along the right short side of the effective pixel region 12.

Thus, in the imaging element 11E-c, light absorbing films 25E-1 to 25E-4 are formed so as to cover the semiconductor elements 101-1 to 101-4, respectively. At this time, as depicted in B of FIG. 12, the light absorbing films 25E-1 to 25E-4 are formed so as to include side faces of the semiconductor elements 101-1 to 101-4, respectively, and cover an overall area of the upper face of the semiconductor elements 101-1 to 101-4, respectively.

Also in the imaging element 11E-c of such a configuration as describe above, reflected light in the effective pixel peripheral region 15 can be suppressed, and an image of high picture quality free from flare, ghost, or the like can be imaged similarly to the imaging element 11E.

<Seventh Configuration Example of Imaging Element>

A seventh embodiment of the imaging element to which the present technology is applied is described with reference to FIG. 14.

Figure 14:
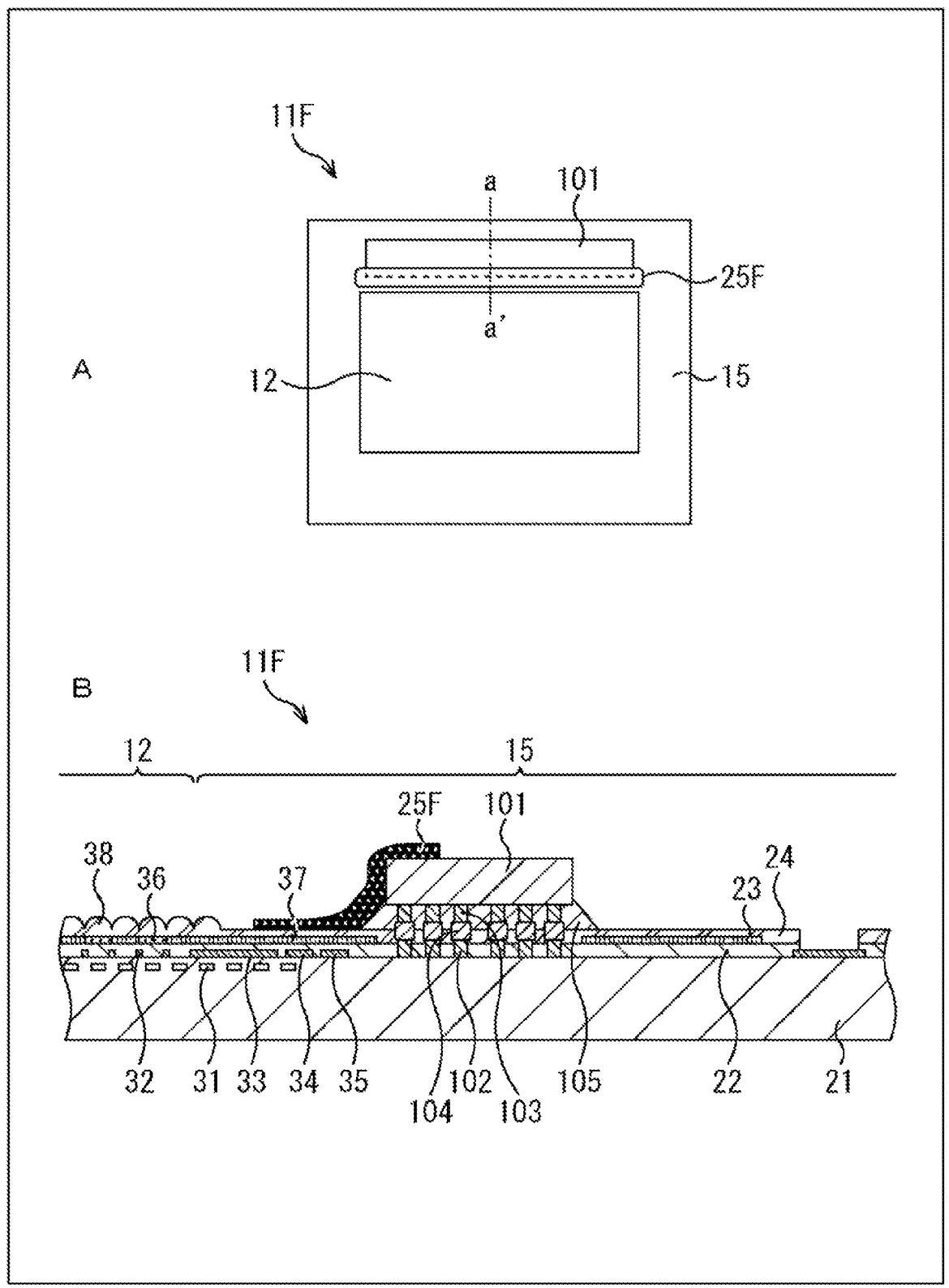
FIG. 14 is a view depicting an example of a configuration of a seventh embodiment of the imaging element.

A of FIG. 14 depicts a schematic configuration when the imaging element 11F is viewed in plan similarly to A of FIG. 1, and B of FIG. 14 depicts an a-a' cross section of the imaging element 11F of A of FIG. 14 similarly as in B of FIG. 1. Components of the imaging element 11F depicted in FIG. 14 common to those of the imaging element 11 of FIG. 1 are denoted by the same reference signs, and detailed description of them is omitted.

In particular, the imaging element 11F is configured by stacking a semiconductor substrate 21, a first flattening film 22, and a microlens layer 24 similarly to the imaging element 11 of FIG. 1. It is to be noted that, in FIG. 14, for example, illustration of the OPB region 13 and the peripheral region 14 depicted in FIG. 1 is omitted and they are depicted collectively as effective pixel peripheral region 15, and also illustration of the reflection preventing film 26 is omitted.

Further, in the imaging element 11F, a semiconductor element 101 is mounted on the semiconductor substrate 21 in the effective pixel peripheral region 15 similarly to the imaging element 11E of FIG. 12. Further, as depicted in B of FIG. 14, in the imaging element 11F, a light absorbing film 25F is formed so as to cover the semiconductor element 101. In particular, the light absorbing film 25F is formed so as to include side faces of the semiconductor element 101 at least on the effective pixel region 12 side and cover part of the upper face of the semiconductor element 101. Meanwhile, the light absorbing film 25E is formed such that it covers the underfill resin 105 on the effective pixel region 12 side and extends over the microlens layer 24 on the effective pixel region 12 side.

The imaging element 11F is configured in this manner, and can suppress reflected light as is reflected toward the effective pixel region 12 in the effective pixel peripheral region 15 by the light absorbing film 25F. Consequently, for example, where the imaging element 11F is used in combination with such a light decomposition prism 63 as described above with reference to FIG. 9, re-reflected light that is generated in the light decomposition prism 63 or light incident as stray light to the effective pixel region 12 of the imaging element 11F can be reduced. As a result, an image of high picture quality free from flare, ghost, or the like can be imaged by the imaging element 11F.

Figure 15:
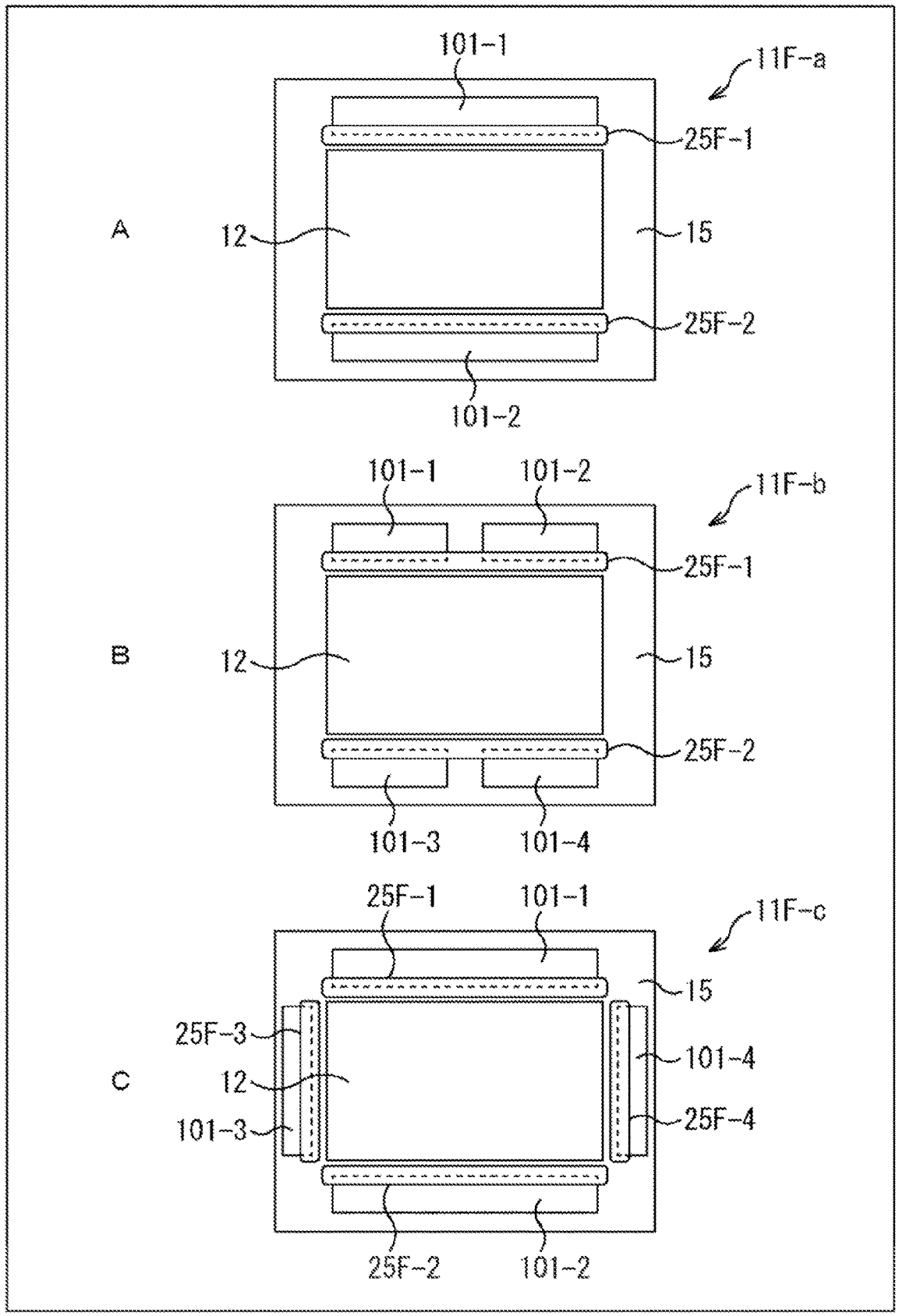
FIG. 15 is a view illustrating a modification of the imaging element of FIG. 14.

First to third modifications of the imaging element 11F are depicted in FIG. 15.

For example, the imaging element 11F-a that is a first modification depicted in A of FIG. 15 is configured such that two semiconductor elements 101-1 and 101-2 are mounted in the effective pixel peripheral region 15. In particular, in the imaging element 11F-a, the semiconductor element 101-1 is disposed along the upper long side of the effective pixel region 12, and the semiconductor element 101-2 is disposed along the lower long side of the effective pixel region 12.

Thus, in the imaging element 11F-a, a light absorbing film 25F-1 is formed so as to cover the semiconductor element 101-1, and another light absorbing film 25F-2 is formed so as to cover the semiconductor element 101-2. At this time, as depicted in B of FIG. 14, the light absorbing film 25F-1 is formed so as to include side faces of the semiconductor element 101 at least on the effective pixel region 12 side and cover part of the upper face of the semiconductor element 101. Similarly, the light absorbing film 25F-2 is formed so as to include side faces of the semiconductor element 101 at least on the effective pixel region 12 side and cover part of the upper face of the semiconductor element 101.

Also in the imaging element 11F-a of such a configuration as describe above, reflected light in the effective pixel peripheral region 15 can be suppressed, and an image of high picture quality free from flare, ghost, or the like can be imaged similarly to the imaging element 11F.

Meanwhile, the imaging element 11F-b that is a second modification depicted in B of FIG. 15 is configured such that four semiconductor elements 101-1 to 101-4 are mounted in the effective pixel peripheral region 15. In particular, in the imaging element 11F-b, the two semiconductor elements 101-1 and 101-2 are disposed side by side in a direction along the upper long side of the effective pixel region 12, and the two semiconductor elements 101-3 to 101-4 are disposed side by side in a direction along the lower long side of the effective pixel region 12.

Further, in the imaging element 11F-b, a light absorbing film 25F-1 is formed so as to cover the semiconductor elements 101-1 and 101-2, and another light absorbing film 25F-2 is formed so as to cover the semiconductor elements 101-3 to 101-4. At this time, as depicted in B of FIG. 14, the light absorbing film 25F-1 is formed so as to include side faces of the semiconductor elements 101-1 and 101-2 at least on the effective pixel region 12 side and cover part of the upper face of the semiconductor elements 101-1 and 101-2. Similarly, the light absorbing film 25F-2 is formed so as to include side faces of the semiconductor elements 101-3 to 101-4 at least on the effective pixel region 12 side and cover part of the upper face of the semiconductor elements 101-3 to 101-4.

Also in the imaging element 11F-b of such a configuration as describe above, reflected light in the effective pixel peripheral region 15 can be suppressed, and an image of high picture quality free from flare, ghost, or the like can be imaged similarly to the imaging element 11F.

On the other hand, the imaging element 11F-c that is a third modification depicted in C of FIG. 15 is configured such that four semiconductor elements 101-1 to 101-4 are mounted in the effective pixel peripheral region 15. In particular, in the imaging element 11F-c, the semiconductor element 101-1 is disposed along the upper long side of the effective pixel region 12, and the semiconductor element 101-2 is disposed along the lower long side of the effective pixel region 12. Further, the imaging element 11F-c is configured such that the semiconductor element 101-3 is disposed along the left short side of the effective pixel region 12 and the semiconductor element 101-4 is disposed along the right short side of the effective pixel region 12.

Thus, in the imaging element 11F-c, light absorbing films 25F-1 to 25F-4 are formed so as to cover the semiconductor elements 101-1 to 101-4, respectively. At this time, the light absorbing films 25F-1 to 25F-4 are formed so as to include side faces of the semiconductor elements 101-1 to 101-4 at least on the effective pixel region 12 side, respectively, and cover part of the upper face of the semiconductor elements 101-1 to 101-4, respectively, as depicted in B of FIG. 14.

Also in the imaging element 11F-c of such a configuration as describe above, reflected light in the effective pixel peripheral region 15 can be suppressed, and an image of high picture quality free from flare, ghost, or the like can be imaged similarly to the imaging element 11F.

<Configuration Example of Imaging Apparatus>

Such imaging elements 11 as described above can be applied to such various electronic equipment, for example, as imaging systems as a digital still camera or a digital video camera, portable telephone sets including an imaging function, or other equipment including an imaging function.

Figure 16:
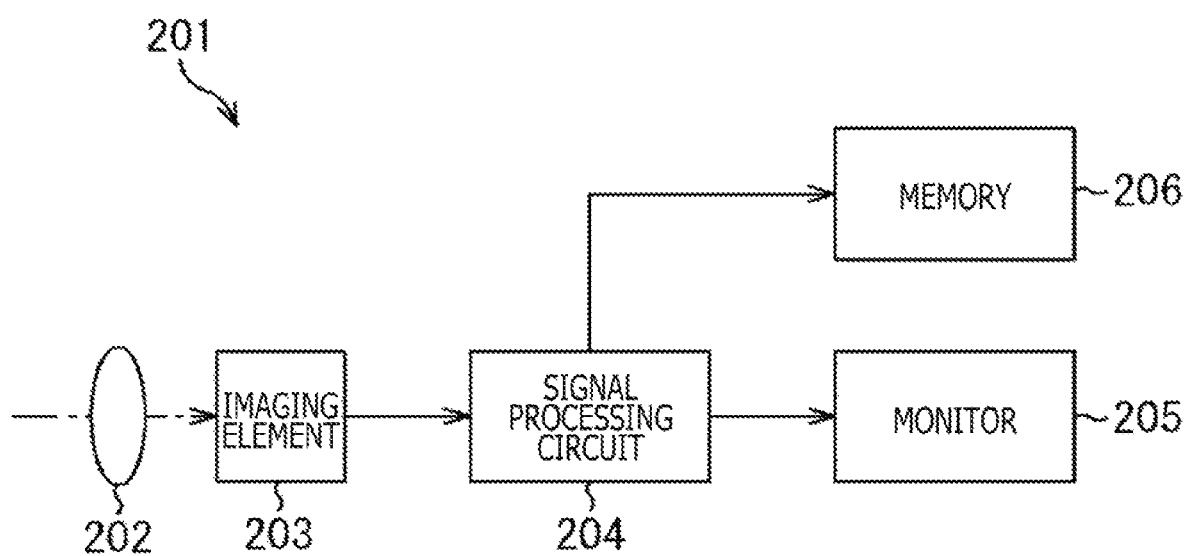
FIG. 16 is a block diagram depicting an example of a configuration of an imaging apparatus.

FIG. 16 is a block diagram depicting a configuration example of an imaging apparatus incorporated in electronic equipment.

As depicted in FIG. 16, the imaging apparatus 201 includes an optical system 202, an imaging element 203, a signal processing circuit 204, a monitor 205, and a memory 206 and can image a still image and a moving image.

The optical system 202 includes one or a plurality of lenses and introduces image light (incident light) into the imaging element 203 from an imaging object such that an image is formed on a light reception face (sensor section) of the imaging element 203.

As the imaging element 203, any of the imaging elements 11 described above is applied. Into the imaging element 203, electrons are accumulated for a fixed period of time in response to an image formed on the light reception face through the optical system 202. Then, a signal according to the electrons accumulated in the imaging element 203 is supplied to the signal processing circuit 204.

The signal processing circuit 204 carries out various signal processes for the pixel signal outputted from the imaging element 203. An image (image data) obtained by the signal processing circuit 204 carrying out the signal processes is supplied to and displayed on the monitor 205 or supplied to and stored (recorded) into the memory 206.

In the imaging apparatus 201 configured in this manner, for example, an image of higher picture quality can be imaged by applying the imaging element 11 described above.

<Example of Use of Image Sensor>

Figure 17:
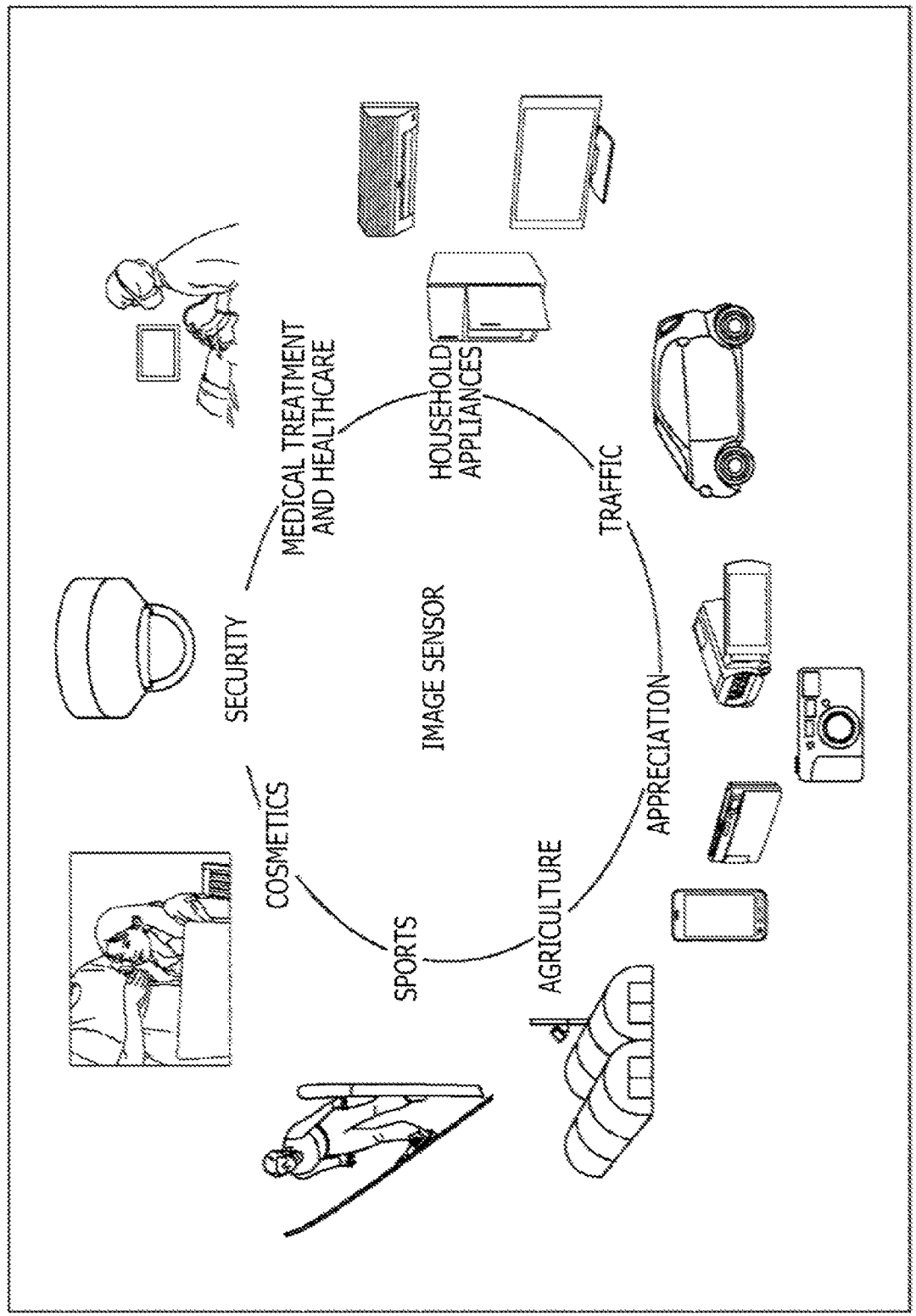
FIG. 17 is a view depicting an example of use in which an image sensor is used.

FIG. 17 is a view depicting an example of use in which the image sensor described above is used.

The image sensor described above can be used in various cases in which visible light, infrared light, ultraviolet light, an X ray, or the like is sensed, for example, in the following manner.

- Apparatus for capturing an image to be provided for appreciation such as a digital camera or portable equipment with a camera function
- Apparatus used for traffic such as a vehicle-mounted sensor for imaging forwardly or rearwardly, around or within an automobile for the object of safe driving such as automatic stopping or recognition of a state of the driver, a surveillance camera for monitoring a traveling vehicle or a road, a distance measurement sensor for measuring the distance between vehicles or the like
- Apparatus used in household appliances such as a TV set, a refrigerator, or an air conditioner for imaging a gesture of a user and performing an apparatus operation in accordance with the gesture Apparatus for medical use or healthcare use such as an endoscope or an apparatus for imaging a blood vessel by reception of infrared light Apparatus for security use such as a surveillance camera for a security application or a camera for a personal authentication application Apparatus for cosmetic use such as a skin measuring instrument for imaging the skin or a microscope for imaging the scalp Apparatus for sports use such as an action camera or a wearable camera for a sports application or the like Apparatus for agricultural use such as a camera for monitoring the state of fields and crops <Application Example to Endoscopic Surgery System>

The technology according to the present disclosure (present technology) can be applied to various products. For example, the technology according to the present disclosure may be applied to an endoscopic surgery system.

Figure 18:
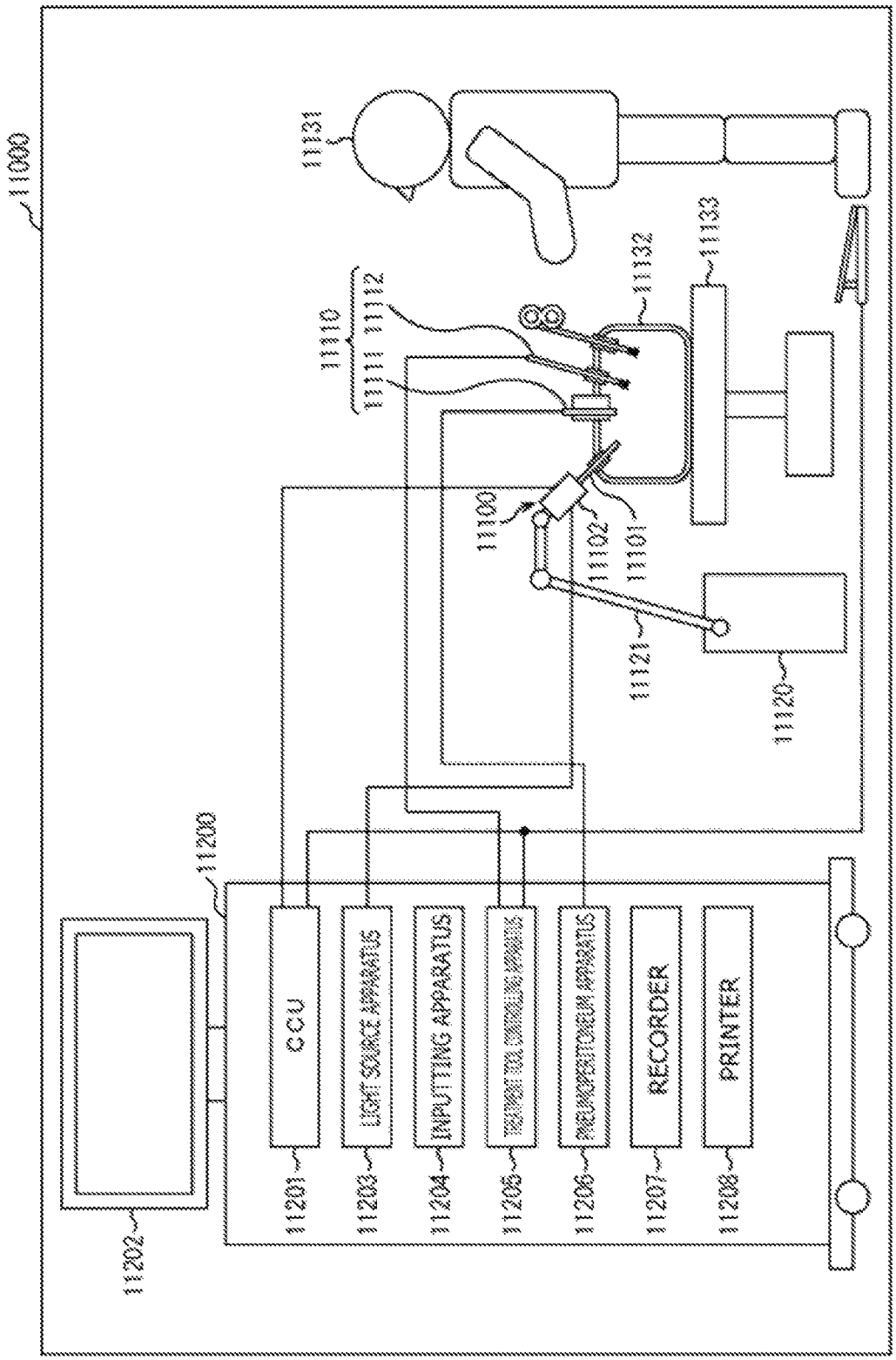
FIG. 18 is a view depicting an example of a schematic configuration of an endoscopic surgery system.

FIG. 18 is a view depicting an example of a schematic configuration of an endoscopic surgery system to which the technology according to an embodiment of the present disclosure (present technology) can be applied.

In FIG. 18, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 19:
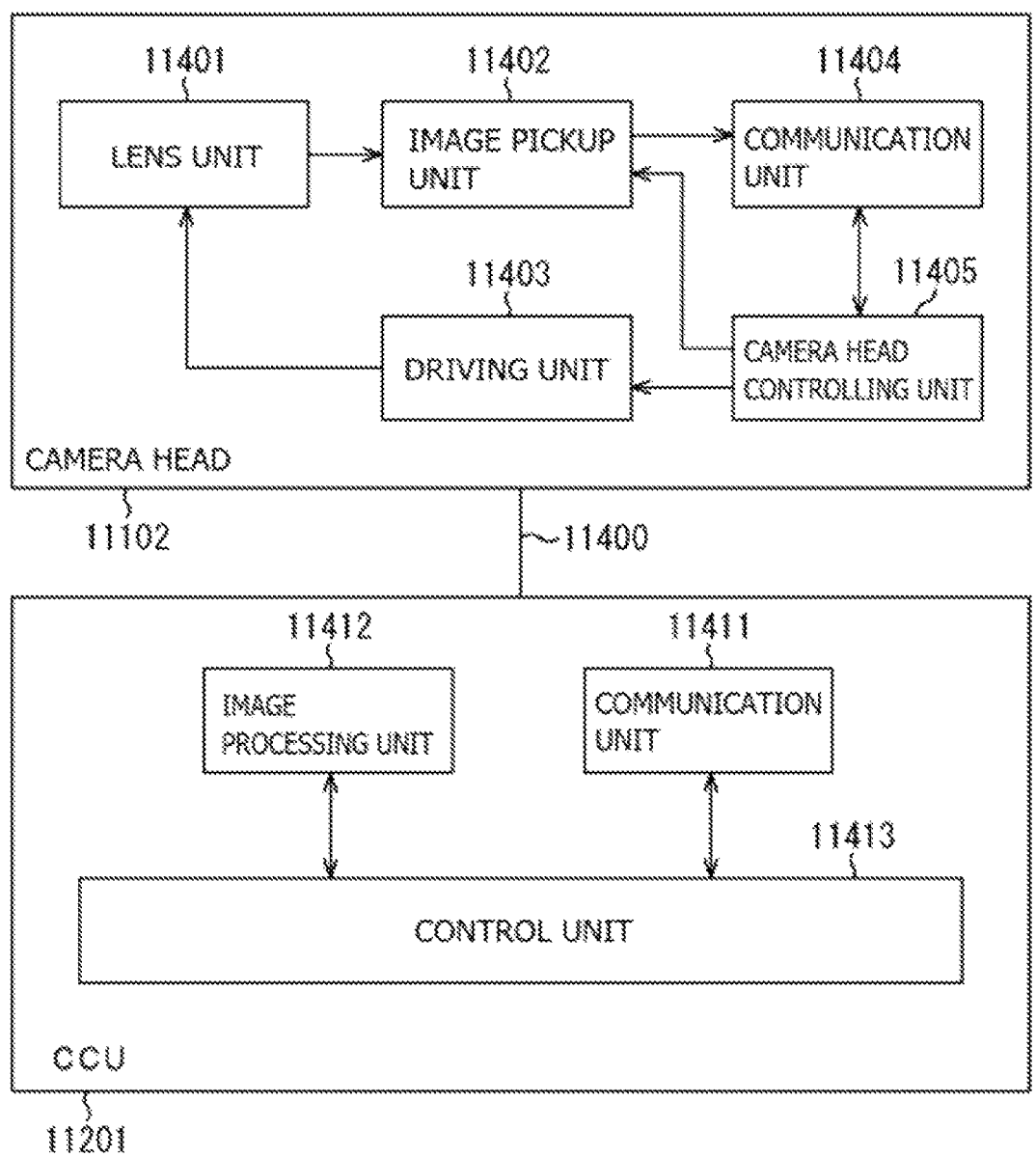
FIG. 19 is a block diagram depicting an example of a functional configuration of a camera head and a camera control unit (CCU).

FIG. 19 is a block diagram depicting an example of a functional configuration of the camera head 11102 and the CCU 11201 depicted in FIG. 18.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure can be applied has been described. The technology according to the present disclosure can be applied to the endoscope 11100, (the image pickup unit 11402 of the) camera head 11102, (the image processing unit 11412 of the) CCU 11201 and so forth from within the configuration described hereinabove. In particular, for example, the imaging element 11 of FIG. 1 can be applied to the image pickup unit 11402. By applying the technology according to the present disclosure to the image pickup unit 11402, an image of the surgical region of higher picture quality can be obtained, and therefore, it becomes possible for the surgeon to check the surgical region with certainty.

<Application Example to In-Vivo Information Acquisition System>

The technology according to the present disclosure (present technology) can be applied to various products. For example, the technology according to the present disclosure may be applied to an endoscope surgical system.

Figure 20:
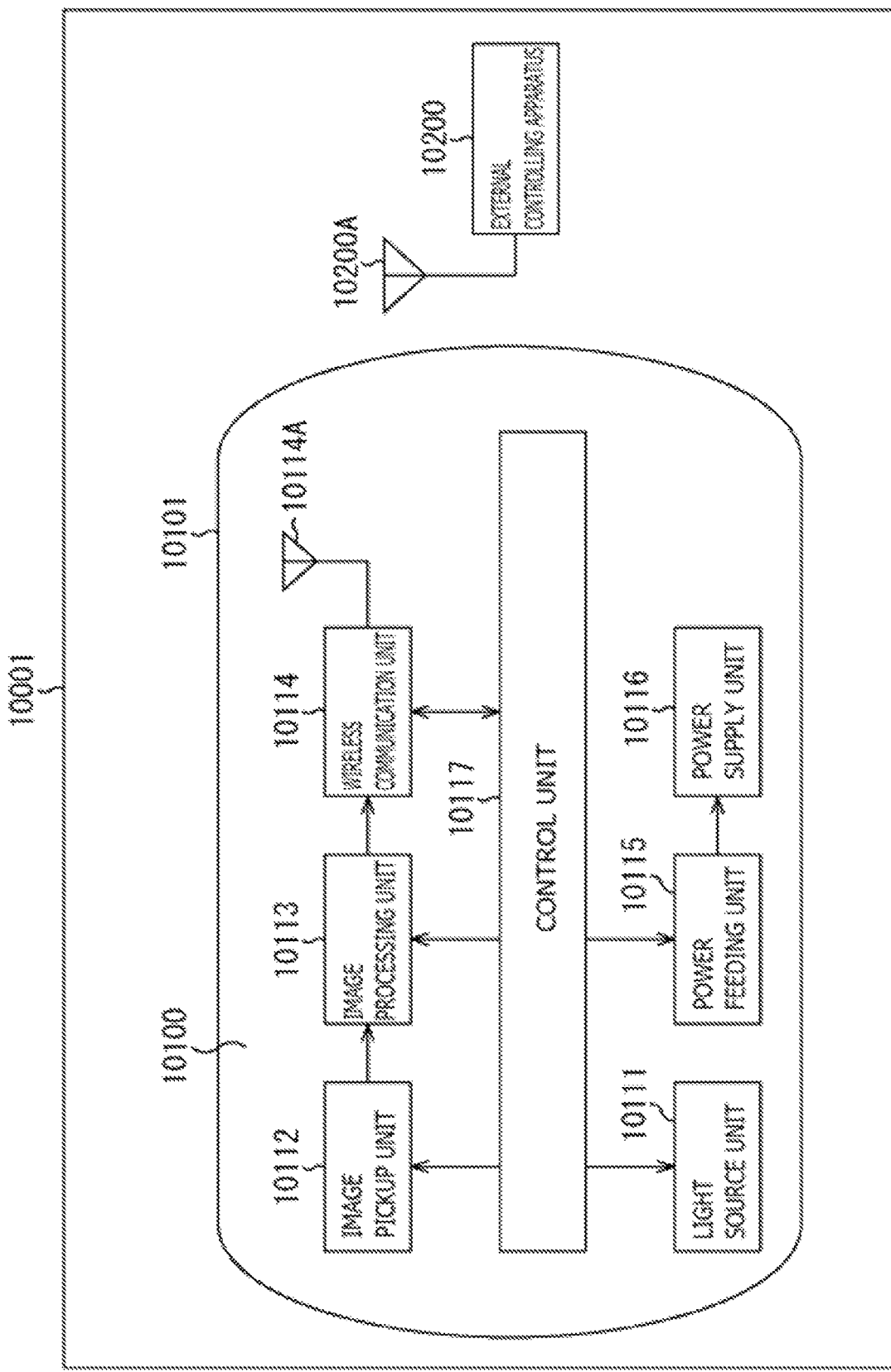
FIG. 20 is a block diagram depicting an example of a schematic configuration of an in-vivo information acquisition system.

FIG. 20 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 20, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of an in-vivo information acquisition system to which the technology according to the present disclosure can be applied has been described. The technology according to the present disclosure can be applied to the image pickup unit 10112 from within the configuration described hereinabove. In particular, for example, the imaging element 11 of FIG. 1 can be applied to the image pickup unit 10112. By applying the technology according to the present disclosure to the image pickup unit 10112, an image of the surgical region of higher picture quality can be obtained, and therefore, it becomes possible to improve the accuracy in inspection.

<Application Example to Mobile Body>

The technology according to the present disclosure (present technology) can be applied to various products. For example, the technology according to the present disclosure may be implemented as an apparatus that is incorporated in any type of mobile body such as an automobile, an electric car, a hybrid electric car, a motorcycle, a bicycle, a personal mobility, an airplane, a drone, a ship, or a robot.

Figure 21:
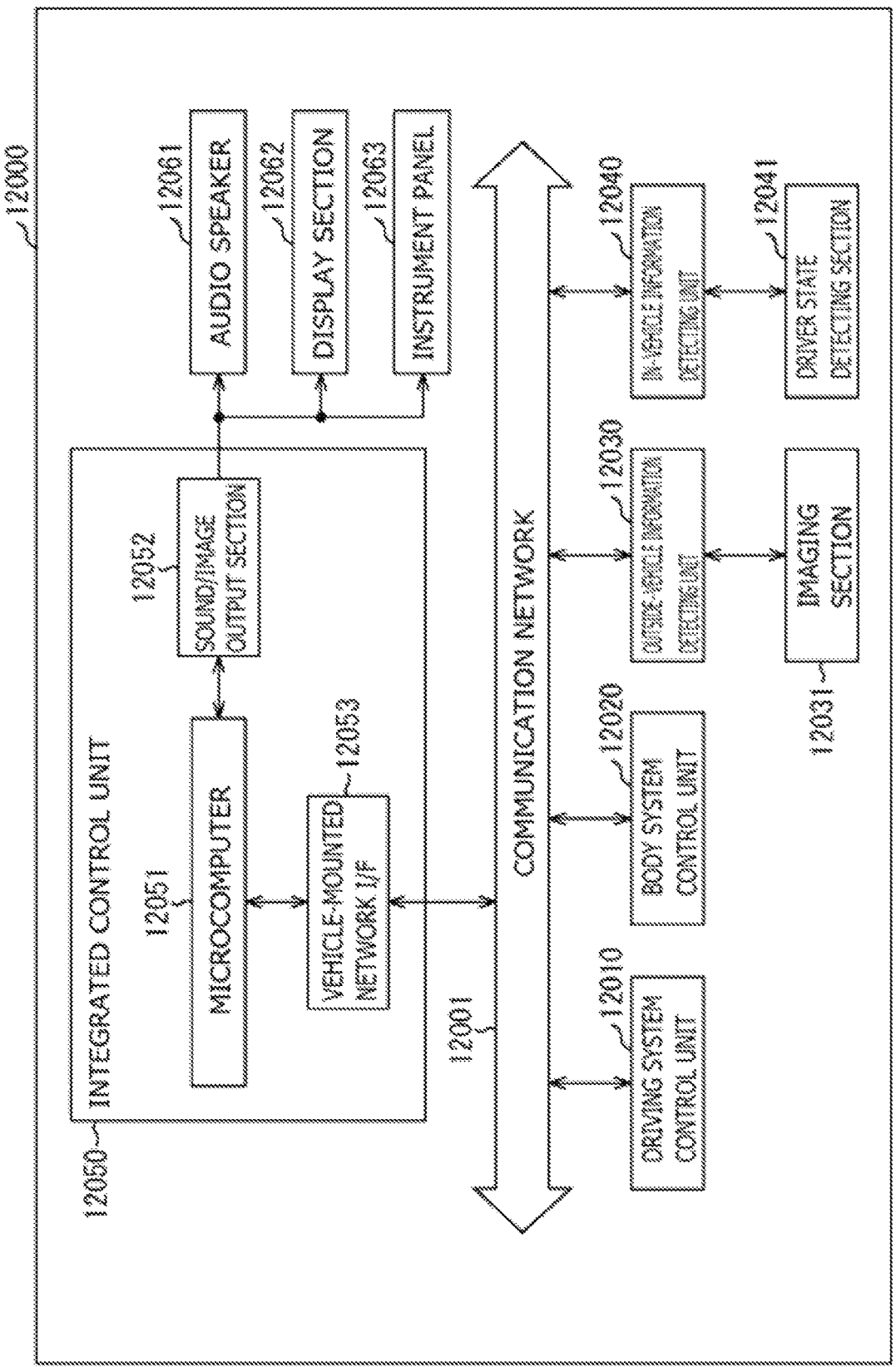
FIG. 21 is a block diagram depicting an example of schematic configuration of a vehicle control system.

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

Figure 22:
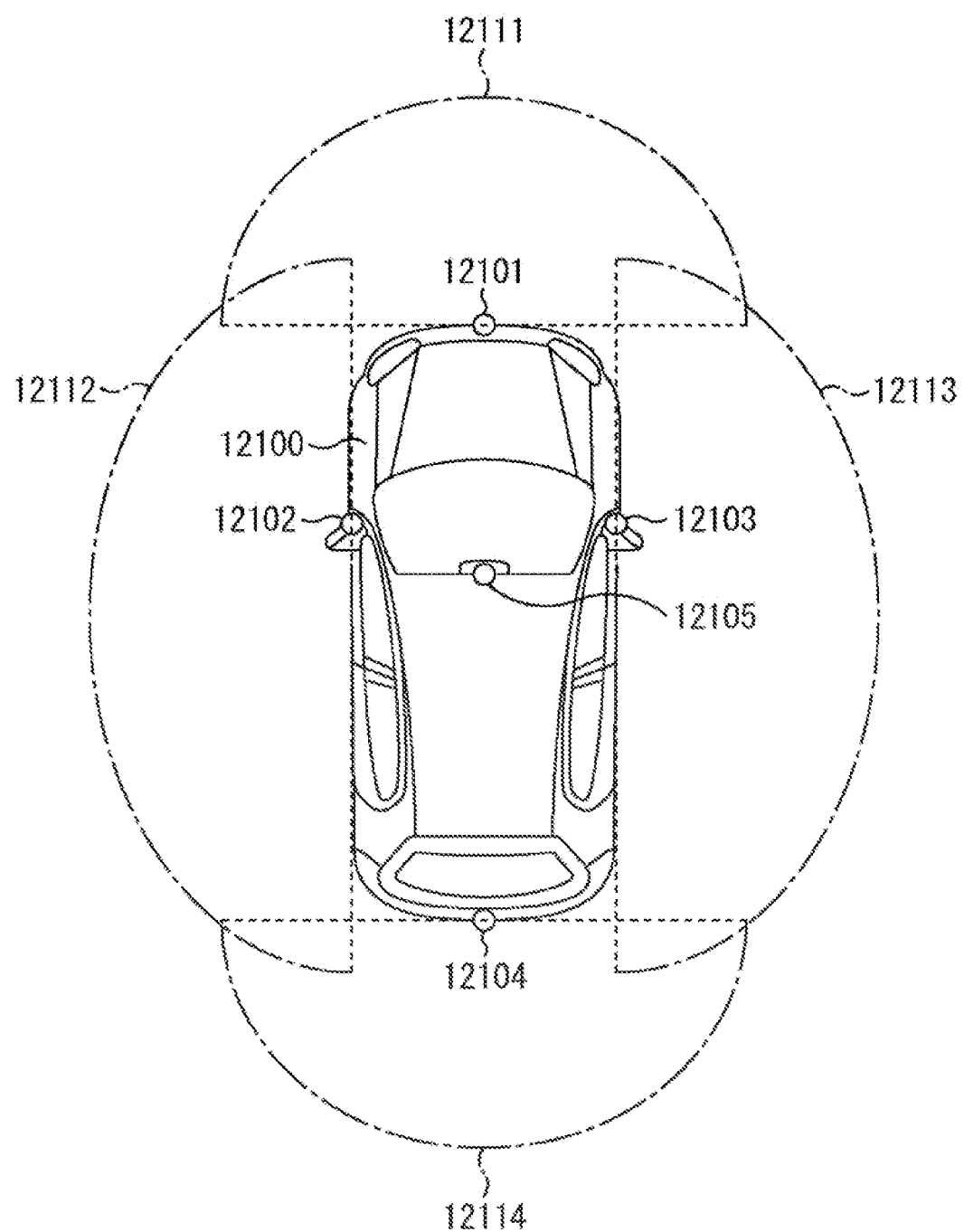
FIG. 22 is a diagram of assistance in explaining an example of installation positions of an outside-vehicle information detecting section and an imaging section.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure can be applied has been described. The technology according to the present disclosure can be applied, for example, to the imaging section 12031 or the like from within the configuration described above. In particular, for example, the imaging element 11 of FIG. 1 can be applied to the imaging section 12031. By applying the technology according to the present disclosure to the imaging section 12031, for example, information outside a vehicle can be acquired in higher picture quality, and improvement and so forth of the safety automatic driving can be implemented.

<Combination Examples of Components>

It is to be noted that also it is possible for the present technology to assume such a configuration as described below.

(1)

An imaging element, including:

a first light absorbing film formed in an effective pixel peripheral region, the effective pixel peripheral region being provided so as to enclose an outer side of an effective pixel region in which a plurality of pixels is disposed in a matrix, so as to cover a semiconductor substrate;

a microlens layer provided as an upper layer than the first light absorbing film and having a microlens formed so as to condense light for each of the pixels in the effective pixel region; and a second light absorbing film provided as an upper layer than the microlens layer and formed in the effective pixel peripheral region.

(2)

The imaging element according to (1) above, further including:

a reflection preventing film formed on the microlens layer in the effective pixel region or the second light absorbing film in the effective pixel peripheral region.

(3)

The imaging element according to (1) or (2) above, in which the effective pixel peripheral region includes an OPB (Optical Black) region in which a photodiode for outputting a pixel signal for defining a level of a black color that becomes a reference when an image is to be generated is disposed.

(4)

The imaging element according to any one of (1) to (3) above, in which the first light absorbing film and the second light absorbing film are formed from a material in which at least one of pigments of red, green, blue, yellow, cyan, magenta, gray, and black is internally added.

(5)

The imaging element according to any one of (1) to (4) above, in which an edge portion of the second light absorbing film is formed in such a shape as to have an angular portion as viewed in cross section.

(6)

The imaging element according to any one of (1) to (5) above, in which a plurality of the microlenses formed by an etching method is provided on the microlens layer.

(7)

The imaging element according to any one of (1) to (5) above, in which a plurality of the microlenses formed by a heat reflow method is provided on the microlens layer.

(8)

The imaging element according to any one of (1) to (7) above, in which a filter that transmits light of a color corresponding to each of the pixels is disposed in the effective pixel region in a layer same as that of the first light absorbing film, and a plurality of the pixels provided in the effective pixel region receives light transmitted through the filters.

(9)

The imaging element according to any one of (1) to (7) above, in which the pixels provided in the effective pixel region receives light in all wavelength range.

(10)

The imaging element according to any one of (1) to (9) above, in which an inter-pixel light blocking film for blocking light between a plurality of the pixels is disposed in a layer same as that of the first light absorbing film.

(11)

The imaging element according to any one of (1) to (10) above, in which a grooved portion is formed on the second light absorbing film so as to divide the effective pixel region and a bonding pad provided in the effective pixel peripheral region.

(12)

The imaging element according to any one of (1) to (11) above, in which the second light absorbing film is formed so as to cover a semiconductor element mounted on the semiconductor substrate in the effective pixel peripheral region.

(13)

The imaging element according to (12) above, in which the second light absorbing film is formed so as to include side faces and cover an overall area of the semiconductor element.

(14)

The imaging element according to (12) above, in which the second light absorbing film is formed so as to cover side faces of the semiconductor element at least on the effective pixel region side.

(15)

A fabrication method, including the steps of:

forming a first light absorbing film in an effective pixel peripheral region, the effective pixel peripheral region being provided so as to enclose an outer side of an effective pixel region in which a plurality of pixels is disposed in a matrix, so as to cover a semiconductor substrate;

forming, in a microlens layer provided as an upper layer than the first light absorbing film, a microlens for condensing light for each of the pixels in the effective pixel region; and forming a second light absorbing film provided as an upper layer than the microlens layer in the effective pixel peripheral region.

(16)

Electronic equipment, including:
an imaging element including
a first light absorbing film formed in an effective pixel peripheral region, the effective pixel peripheral region being provided so as to enclose an outer side of an effective pixel region in which a plurality of pixels is disposed in a matrix, so as to cover a semiconductor substrate,
a microlens layer provided as an upper layer than the first light absorbing film and having a microlens formed so as to condense light for each of the pixels in the effective pixel region, and
a second light absorbing film provided as an upper layer than the microlens layer and formed in the effective pixel peripheral region.

It is to be noted that the present embodiment is not limited to the embodiments described hereinabove but can be altered in various manners without departing from the subject matter of the present disclosure.

REFERENCE SIGNS LIST

11 Imaging element, 12 Effective pixel region, 13 OPB region, 14 Peripheral region, 15 Effective pixel peripheral region, 16 Bonding pad, 17 Pixel, 21 Semiconductor substrate, 22 First flattening film, 23 Color filter layer, 24 Microlens layer, 25 Light absorbing film, 26 Reflection preventing film, 31 Photodiode, 32 Inter-pixel light blocking film, 33 OPB light blocking film, 34 and 35 Wiring line, 36 Filter, 37 Light absorbing film, 38 Microlens

What is claimed is:
1. An imaging element, comprising:
a first light absorbing film formed in an effective pixel peripheral region, the effective pixel peripheral region being provided so as to enclose an outer side of an effective pixel region in which a plurality of pixels is disposed in a matrix formed in a semiconductor substrate;
a microlens layer, wherein the microlens layer is on a light incident surface side of the first light absorbing film, wherein the microlens layer includes a plurality of microlenses, and wherein the microlenses are formed so as to condense light for each of the pixels in the effective pixel region; and
a second light absorbing film formed in the effective pixel peripheral region, wherein the second light absorbing film is on a light incident surface side of the microlens layer, wherein, in a plan view, at least a portion of the first light absorbing film, at least a portion of the microlens layer, and at least a portion of the second light absorbing film overlap each other in the effective pixel peripheral region, and wherein an edge portion of the second light absorbing film has an angular portion when viewed in cross section.
2. The imaging element according to claim 1, further comprising:
a reflection preventing film formed on the microlens layer in the effective pixel region.
3. The imaging element according to claim 1, wherein
the effective pixel peripheral region includes an OPB (Optical Black) region in which a photodiode for outputting a pixel signal for defining a level of a black color that becomes a reference when an image is to be generated is disposed.
4. The imaging element according to claim 1, wherein
the first light absorbing film and the second light absorbing film are formed from a material in which at least one of pigments of red, green, blue, yellow, cyan, magenta, gray, and black is internally added.
5. The imaging element according to claim 1, wherein
a plurality of the microlenses formed by an etching method is provided on the microlens layer.
6. The imaging element according to claim 1, wherein
a plurality of the microlenses formed by a heat reflow method is provided on the microlens layer.
7. The imaging element according to claim 1, wherein
a filter that transmits light of a color corresponding to each of the pixels is disposed in the effective pixel region in a layer same as that of the first light absorbing film, and a plurality of the pixels provided in the effective pixel region receives light transmitted through the filters.
8. The imaging element according to claim 1, wherein
a plurality of the pixels provided in the effective pixel region receives light in all wavelength ranges.
9. The imaging element according to claim 1, wherein
an inter-pixel light blocking film for blocking light between a plurality of the pixels is disposed in a layer same as that of the first light absorbing film.
10. An imaging element, comprising:
a first light absorbing film formed in an effective pixel peripheral region, the effective pixel peripheral region being provided so as to enclose an outer side of an effective pixel region in which a plurality of pixels is disposed in a matrix formed in a semiconductor substrate;
a microlens layer, wherein the microlens layer is on a light incident surface side of the first light absorbing film, wherein the microlens layer includes a plurality of microlenses, and wherein the microlenses are formed so as to condense light for each of the pixels in the effective pixel region; and
a second light absorbing film formed in the effective pixel peripheral region, wherein the second light absorbing film is on a light incident surface side of the microlens layer, wherein, in a plan view, at least a portion of the first light absorbing film, at least a portion of the microlens layer, and at least a portion of the second light absorbing film overlap each other in the effective pixel peripheral region,
wherein a grooved portion is formed on the second light absorbing film so as to divide the effective pixel region and a bonding pad provided in the effective pixel peripheral region.
11. The imaging element according to claim 10, further comprising:
a reflection preventing film formed on the second light absorbing film in the effective pixel peripheral region.
12. The imaging element according to claim 10, wherein
the effective pixel peripheral region includes an OPB (Optical Black) region in which a photodiode for outputting a pixel signal for defining a level of a black color that becomes a reference when an image is to be generated is disposed.
13. The imaging element according to claim 10, wherein
the first light absorbing film and the second light absorbing film are formed from a material in which at least one of pigments of red, green, blue, yellow, cyan, magenta, gray, and black is internally added.
14. An imaging element, comprising:
a first light absorbing film formed in an effective pixel peripheral region, the effective pixel peripheral region being provided so as to enclose an outer side of an effective pixel region in which a plurality of pixels is disposed in a matrix formed in a semiconductor substrate;

a microlens layer, wherein the microlens layer is on a light incident surface side of the first light absorbing film, wherein the microlens layer includes a plurality of microlenses, and wherein the microlenses are formed so as to condense light for each of the pixels in the effective pixel region; and a second light absorbing film formed in the effective pixel peripheral region, wherein the second light absorbing film is on a light incident surface side of the microlens layer, wherein, in a plan view, at least a portion of the first light absorbing film, at least a portion of the microlens layer, and at least a portion of the second light absorbing film overlap each other in the effective pixel peripheral region, wherein the second light absorbing film is formed so as to cover a semiconductor element mounted on the semiconductor substrate in the effective pixel peripheral region, and wherein the second light absorbing film is formed so as to include side faces and cover an overall area of the semiconductor element.

15. The imaging element according to claim 14, further comprising:

a reflection preventing film formed on the microlens layer in the effective pixel region and on the second light absorbing film in the effective pixel peripheral region.

16. The imaging element according to claim 14, wherein the effective pixel peripheral region includes an OPB (Optical Black) region in which a photodiode for outputting a pixel signal for defining a level of a black color that becomes a reference when an image is to be generated is disposed.

17. An imaging element, comprising:

a first light absorbing film formed in an effective pixel peripheral region, the effective pixel peripheral region being provided so as to enclose an outer side of an effective pixel region in which a plurality of pixels is disposed in a matrix formed in a semiconductor substrate;

a microlens layer, wherein the microlens layer is on a light incident surface side of the first light absorbing film, wherein the microlens layer includes a plurality of microlenses, and wherein the microlenses are formed so as to condense light for each of the pixels in the effective pixel region; and a second light absorbing film formed in the effective pixel peripheral region, wherein the second light absorbing film is on a light incident surface side of the microlens layer, wherein, in a plan view, at least a portion of the first light absorbing film, at least a portion of the microlens layer, and at least a portion of the second light absorbing film overlap each other in the effective pixel peripheral region, wherein the second light absorbing film is formed so as to cover a semiconductor element mounted on the semiconductor substrate in the effective pixel peripheral region, and wherein the second light absorbing film is formed so as to cover side faces of the semiconductor element at least on the effective pixel region side.

18. The imaging element according to claim 17, wherein the effective pixel peripheral region includes an OPB (Optical Black) region in which a photodiode for outputting a pixel signal for defining a level of a black color that becomes a reference when an image is to be generated is disposed.

19. The imaging element according to claim 17, further comprising:

a reflection preventing film formed on the microlens layer in the effective pixel region and on the second light absorbing film in the effective pixel peripheral region.

* * * * *